(12) United States Patent
Choi et al.

(10) Patent No.: US 9,837,360 B2
(45) Date of Patent: Dec. 5, 2017

(54) WAFER LEVEL PACKAGES AND ELECTRONICS SYSTEM INCLUDING THE SAME

(71) Applicant: SK hynix Inc., Icheon-si Gyeonggi-do (KR)

(72) Inventors: Hyeong Seok Choi, Seoul (KR); Ki Jun Sung, Cheongju-si (KR); Jong Hoon Kim, Suwon-si (KR); Young Geun Yoo, Icheon-si (KR); Pil Soon Bae, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/243,296

(22) Filed: Aug. 22, 2016

(65) Prior Publication Data

US 2017/0170127 A1      Jun. 15, 2017

(30) Foreign Application Priority Data

Dec. 11, 2015   (KR) .................. 10-2015-0177492
Mar. 22, 2016   (KR) .................. 10-2016-0034059

(51) Int. Cl.
*H01L 23/544*    (2006.01)
*H01L 23/00*     (2006.01)
(Continued)

(52) U.S. Cl.
CPC ........ *H01L 23/544* (2013.01); *H01L 23/3142* (2013.01); *H01L 23/498* (2013.01);
(Continued)

(58) Field of Classification Search
CPC ............ H01L 21/00; H01L 2924/0002; H01L 2924/00; H01L 23/544; H01L 23/00;
(Continued)

(56) References Cited

U.S. PATENT DOCUMENTS

| | | | |
|---|---|---|---|
| 8,754,514 B2 * | 6/2014 | Yu | H01L 23/49816 257/686 |
| 9,040,316 B1 * | 5/2015 | Scanlan | H01L 21/76879 438/15 |
| 2007/0246826 A1 * | 10/2007 | Chung | H01L 23/3114 257/734 |

(Continued)

FOREIGN PATENT DOCUMENTS

KR        1020140111523 A       9/2014

*Primary Examiner* — Alexander Oscar Williams
(74) *Attorney, Agent, or Firm* — William Park & Associates Ltd.

(57) ABSTRACT

Wafer level packages are provided. The wafer level package includes alignment marks disposed at a first surface of a protection wafer, a semiconductor die disposed on the first surface of the protection wafer to be spaced apart from the alignment marks, a first photosensitive dielectric layer covering the semiconductor die and having a flat top surface, and a second dielectric layer covering the flat top surface of the first photosensitive dielectric layer. Redistribution lines are disposed between the first photosensitive dielectric layer and the second dielectric layer and electrically connected to the semiconductor die through first opening portions penetrating the first photosensitive dielectric layer. Outer connectors are disposed on the second dielectric layer and electrically connected to the redistribution lines through second opening portions penetrating the second dielectric layer.

19 Claims, 32 Drawing Sheets

(51) Int. Cl.
*H01L 23/31* (2006.01)
*H01L 23/498* (2006.01)

(52) U.S. Cl.
CPC .. *H01L 23/49816* (2013.01); *H01L 23/49827* (2013.01); *H01L 23/49838* (2013.01); *H01L 23/49894* (2013.01); *H01L 23/562* (2013.01); *H01L 24/14* (2013.01); *H01L 2223/54426* (2013.01)

(58) Field of Classification Search
CPC ..... H01L 23/31; H01L 23/498; H01L 23/562; H01L 23/3142; H01L 24/14; H01L 23/49816; H01L 23/49827; H01L 23/49838; H01L 2223/54426
USPC .......................................... 257/737, 738, 778
See application file for complete search history.

(56) References Cited

U.S. PATENT DOCUMENTS

| | | | | |
|---|---|---|---|---|
| 2008/0274579 | A1* | 11/2008 | Yang | H01L 27/14618 438/64 |
| 2009/0085204 | A1* | 4/2009 | Park | H01L 21/56 257/737 |
| 2009/0244965 | A1* | 10/2009 | Reohr | G11C 11/16 365/173 |
| 2011/0227186 | A1* | 9/2011 | Chang | H01L 23/481 257/448 |
| 2013/0320471 | A1* | 12/2013 | Luan | H01L 27/14618 257/432 |
| 2015/0155248 | A1* | 6/2015 | Lin | H01L 21/76879 257/737 |
| 2016/0276307 | A1* | 9/2016 | Lin | H01L 21/561 |

* cited by examiner

WAFER LEVEL PACKAGES AND ELECTRONICS SYSTEM INCLUDING THE SAME

CROSS-REFERENCE TO RELATED APPLICATIONS

The present application claims priority under 35 U.S.C. 119(a) to Korean Patent Application No. 10-2015-0177492 filed on Dec. 11, 2015 and Korean Patent Application No. 10-2016-0034059 filed on Mar. 22, 2016, which are herein incorporated by references in their entirety.

BACKGROUND

1. Technical Field

Embodiments of the present disclosure may generally relate to semiconductor packages and, more particularly, to wafer level packages and methods of manufacturing the same.

2. Related Art

Semiconductor devices employed in electronic systems may include various electronic circuit elements. The electronic circuit elements may be integrated in and/or on a semiconductor substrate to constitute a semiconductor chip or a semiconductor die. The semiconductor chip or the semiconductor die may be encapsulated to provide a semiconductor package. The semiconductor package may be provided to protect the semiconductor chip or the semiconductor die therein from an external force. The semiconductor package is widely employed in each of the electronic systems such as computers, mobile systems or data storage media. Recently, thin semiconductor packages have been increasingly in demand with the development of lighter and smaller electronic systems, such as, smart phones.

As the thin semiconductor packages are increasingly in demand, a thickness of a semiconductor substrate constituting the semiconductor chips in the semiconductor packages has been reduced. Thus, a lot of effort has been focused on preventing warpage of the semiconductor packages or the semiconductor substrates during a package process. In addition, as the semiconductor packages are scaled down and the number of connectors (e.g., connection pads) of the semiconductor packages increases, many techniques have been proposed to realize high performance semiconductor packages having a fine pitch of the pads.

SUMMARY

According to various embodiments, there may be provided packages, semiconductors, and wafer level packages. According to various embodiments, there may be provided methods of manufacturing packages, semiconductors, and wafer level packages. A method of manufacturing a wafer level package may include forming alignment marks. The method may include mounting semiconductor dice on the first surface. The method may include attaching a first photosensitive dielectric film to the protection wafer. The method may include planarizing a top surface of the first photosensitive dielectric layer opposite to the protection wafer. The method may include exposuring portions of the planarized first photosensitive dielectric layer. The method may include developing the exposured first photosensitive dielectric layer. The method may include forming redistribution lines on the first photosensitive dielectric layer. The redistribution lines may be formed to be electrically connected to the semiconductor dice through the opening portions. A second dielectric layer may be formed to cover the redistribution lines.

DETAILED DESCRIPTION

Figure 1:
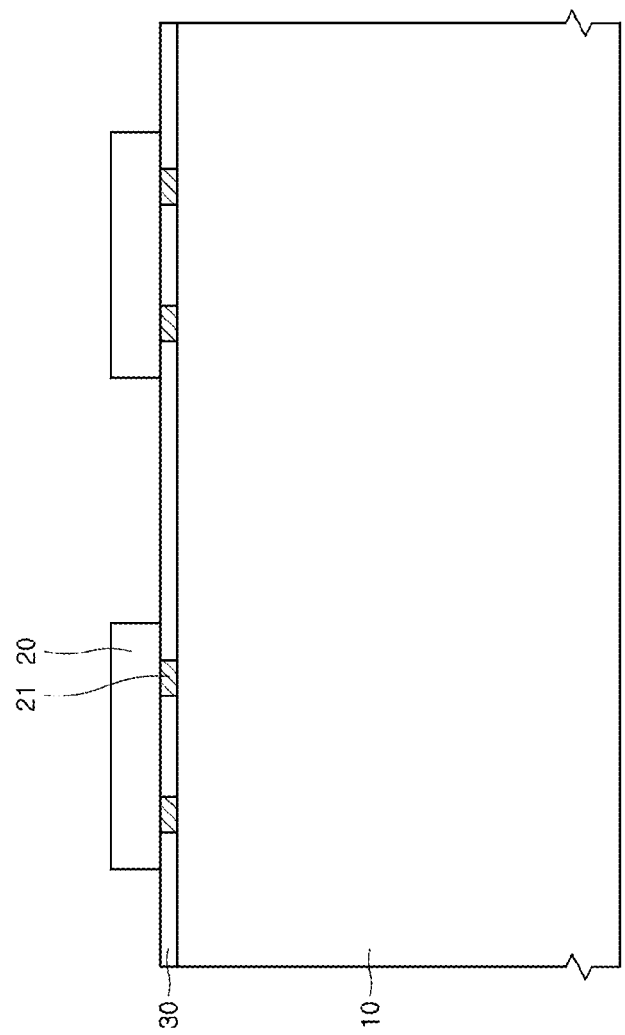
FIGS. 1 to 3 are cross-sectional views illustrating a representation of an example of a failure according to a die shift in fabrication of a wafer level package.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments only and are not intended to limit the present disclosure.

Semiconductor packages according to the following embodiments may include electronic devices such as semiconductor dice or semiconductor chips, and the semiconductor dice or the semiconductor chips may be obtained by separating a semiconductor substrate such as a wafer including electronic circuits into a plurality of pieces using a die sawing process. The semiconductor chips may correspond to memory chips, logic chips or application specific integrated circuit (ASIC) chips. The memory chips may include dynamic random access memory (DRAM) circuits, static random access memory (SRAM) circuits, flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. Each of the semiconductor packages may include a package substrate and a semiconductor chip mounted on the package substrate, and the package substrate may be used to electrically connect the semiconductor chip to an external device. Thus, the package substrate may include circuit traces disposed on and/or in a substrate body comprised of a dielectric material, unlike the semiconductor substrate. The package substrate may be a printed circuit board (PCB). The semiconductor packages may be employed in communication systems such as, for example but not limited to, mobile phones, electronic systems associated with biotechnology or health care, or wearable electronic systems.

The same reference numerals refer to the same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

The present disclosure may provide methods of manufacturing wafer level packages as well as wafer level packages manufactured thereby. The wafer level packages may be manufactured using a protection substrate having a shape of a wafer such as a silicon wafer. The wafer level packages according to the following embodiments may be manufactured to have a fan out semiconductor package form. Each of the fan out semiconductor packages may have a structure that a semiconductor chip is electrically connected to outer connectors such as solder balls through redistribution lines disposed on a molding member, even though the semiconductor chip is smaller than the fan out semiconductor package.

The fan out semiconductor packages, that is, fan out wafer level packages may be realized by performing a wafer molding process for forming a molding member such as an epoxy molding compound (EMC) material on a wafer using a temporary wafer as a carrier and by forming redistribution lines on the molding member. However, in such a case, the fan out wafer level packages may exhibit some issues such as a poor package topography, a vulnerability to warpage, a failure due to a die shift, a chip to mold non-planarity, or the like. These issues may act as obstacles in realizing high performance packages that include interconnections having a fine pitch. That is, there may be some difficulties in reducing a pitch and a size of connectors such as pads of the wafer level packages as well as in reducing a pitch and a size of interconnection lines of the wafer level packages.

The die shift phenomenon may occur due to the temporary bonding between the temporary wafer and semiconductor chips (or semiconductor dice). The temporary wafer may be bonded to the semiconductor chips by a temporary adhesive. However, since the temporary wafer has to be removed finally, the temporary adhesive may have a relatively weak adhesive strength. Thus, during the wafer molding process, the temporary adhesive may be deformed by a pressure of the EMC material to cause a position shift of the semiconductor chips. After the wafer molding process, the EMC material may be cooled down to cause the shrinkage of the EMC material. In such a case, the semiconductor chips may move toward a central portion of the wafer. Accordingly, positions of connection pads of the semiconductor chips may change to cause a misalignment between the connection pads and pad openings for exposing the connection pads when an insulation layer for defining the pad openings is formed. As a result, while solder balls are attached to the connection pads, the solder balls may be misaligned with the connection pads.

The chip to mold non-planarity issue may occur at a boundary between the semiconductor chips and the molding member. After the temporary adhesive is supplied onto the temporary wafer and a wafer including the semiconductor chips is located on the temporary adhesive, a high pressure may be applied to the semiconductor chips and the temporary adhesive during a molding process for forming a molding member. The high pressure applied to the semiconductor chips and the temporary adhesive may lead to deformation of the temporary adhesive having a relatively low modulus, while the semiconductor chips having a relatively high modulus is hardly deformed. As a result, a surface level difference of temporary adhesive may be formed at a boundary between the semiconductor chips and the molding member. Accordingly, when redistribution lines are formed over the semiconductor chips and the molding member in a subsequent process, the surface level difference of temporary adhesive may cause a pattern distortion of the redistribution lines.

When the redistribution lines are formed to have a multi-layered structure and an insulation layer covering the redistribution lines is formed using a spin coating process, a photolithography process may not be uniformly performed on a surface of the insulation layer according to a pattern density of the redistribution lines. This non-uniform photolithography process may cause a pattern distortion.

If a volume of the molding member (e.g., EMC material) having a relatively high coefficient of thermal expansion (CTE) is greater than a volume of a silicon material having a relatively low coefficient of thermal expansion (CTE) in a package, the wafer may readily warp during or after a wafer molding process for forming the molding member. While the molding member is formed and the redistribution lines are formed, a heating step and a cooling step may be repeatedly performed to cause concentration of a stress due to a CTE difference between the molding member and the silicon material. Thus, the wafer may readily warp. The warpage of the wafer may cause malfunction of process apparatuses or process failures.

Figure 2:
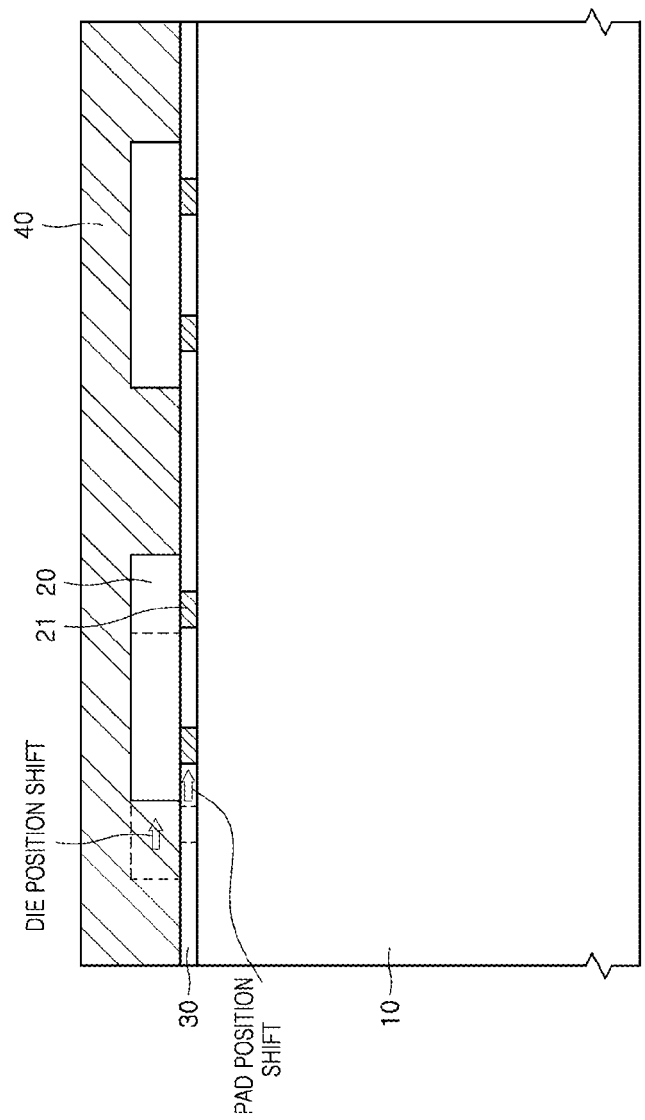
Figure 3:
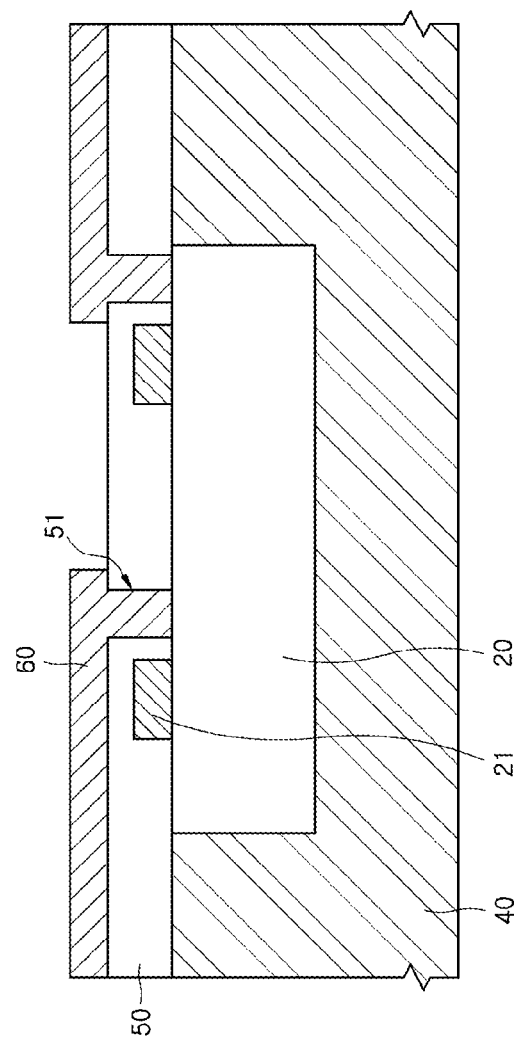

FIGS. 1, 2 and 3 are cross-sectional views illustrating a representation of an example of a failure according to a die shift in fabrication of a wafer level package.

Referring to FIG. 1, dice 20 may be attached to a surface of a carrier 10 using a temporary adhesive 30. The dice 20 may be attached to the carrier 10 so that connection pads 21 of the dice 20 face the carrier 10. Referring to FIG. 2, while an EMC layer 40 is formed to cover the dice 20, at least one of the dice 20 may be laterally shifted. As a result, a position of the at least one of the dice 20 may be changed as compared with an initial position thereof. If the die 20 is laterally shifted, positions of the connection pads 21 of the die 20 may also be changed. After the EMC layer 40 is formed, the carrier 10 may be removed from the dice 20 and the EMC layer 40. The carrier 10 may be removed by reducing an adhesive strength of the temporary adhesive 30. The adhesive strength of the temporary adhesive 30 may be reduced by irradiating an ultraviolet (UV) ray onto the temporary adhesive 30 or by applying heat to the temporary adhesive 30. Referring to FIG. 3, an insulation layer 50 may be formed on a surface of the EMC layer 40 to cover the dice 20 and the connection pads 21 of the dice 20, and opening portions 51 penetrating the insulation layer 50 may be formed in order to expose the connection pads 21. Redistribution lines 60 may then be formed on the insulation layer 50 and in the opening portions 51. If the die 20 is laterally shifted during formation of the EMC layer 40 as described above, the opening portions 51 may be formed to be misaligned with the connection pads 21. As a result, the redistribution lines 60 may be electrically disconnected from the connection pads 21 to cause a connection failure, as illustrated in FIG. 3.

Figure 4:
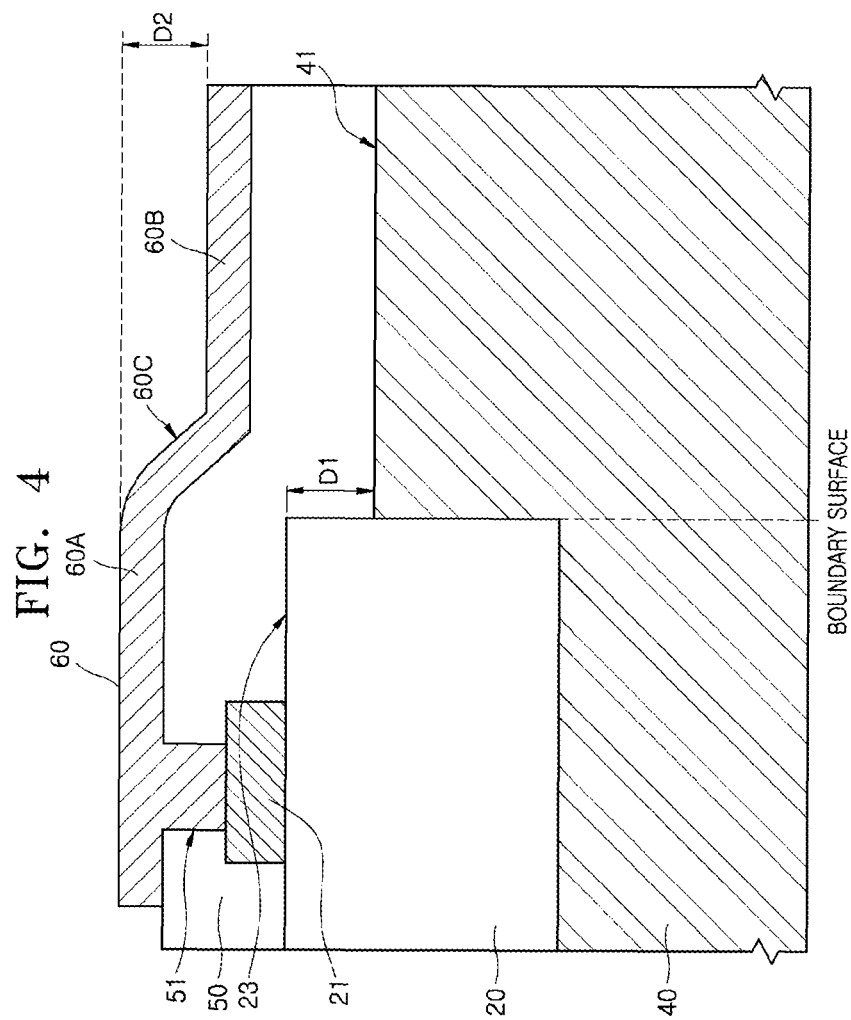
FIGS. 4 and 5 illustrate a representation of an example of a failure according to a non-planarity between a die and an epoxy molding compound layer in fabrication of a wafer level package.
Figure 5:
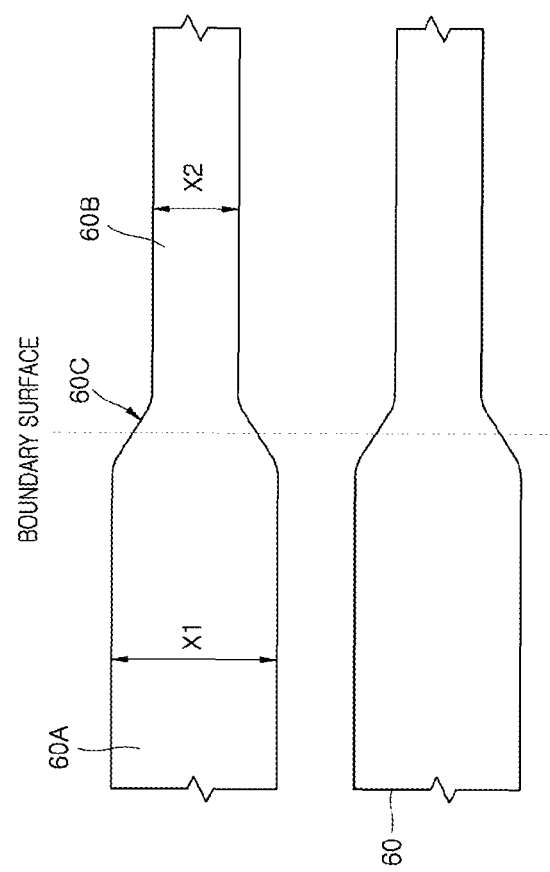

FIGS. 4 and 5 illustrate a process failure according to a non-planarity between a die and an EMC layer in fabrication of a wafer level package. FIG. 4 is a vertical cross-sectional view taken along a length direction of any one of the redistribution lines 60, and FIG. 5 is a plan view of the redistribution lines 60.

Referring to FIG. 4, a non-planarity of the insulation layer 50 may be illustrated on a boundary surface between the EMC layer 40 and a sidewall of the die 20. This is because the temporary adhesive (30 of FIG. 2) contacting the die 20 is pressed down more than the temporary adhesive (30 of FIG. 2) contacting the EMC layer 40 while the EMC layer 40 is formed. Thus, a level difference may be provided between the die 20 and the EMC layer 40. That is, a level difference D1 may exist between a surface 23 of the die 20 and a surface 41 of the EMC layer 40. The insulation layer 50 covering the die 20 and the EMC layer 40 may be formed to have an uneven surface due to the level difference D1 between the die 20 and the EMC layer 40, and a redistribution layer formed on the insulation layer 50 may also have an uneven surface exhibiting a level difference D2. The redistribution lines 60 may be formed by patterning the redistribution layer having a level difference D2. Thus, the level difference D2 may affect a photolithography process for patterning the redistribution layer to form the redistribution lines 60, and each of the redistribution lines 60 may be formed to have a non-uniform width. For example, if the redistribution layer is patterned using a photolithography process and an etch process, it may be difficult to adjust and optimize a depth of focus during the photolithography process because of a non-uniform thickness of a photoresist layer coated on the redistribution layer. Thus, the redistribution line 60 may be formed to include a first portion 60A overlapping with the die 20 and having a width X1 as well as a second portion 60B overlapping with the EMC layer 40 and having a width X2 different from the width X1 (see FIG. 5). Further, the redistribution line 60 may be formed to include a third portion 60C between the first and second portions 60A and 60B. In such a case, if the width X1 is greater than the width X2, a width of a third portion 60C of the redistribution line 60 may be gradually reduced from the first portion 60A toward the second portion 60B, Referring to FIG. 5. The non-uniform width of the redistribution line 60 may lead to degradation of electrical characteristics and reliability of the redistribution line 60.

Figure 6:
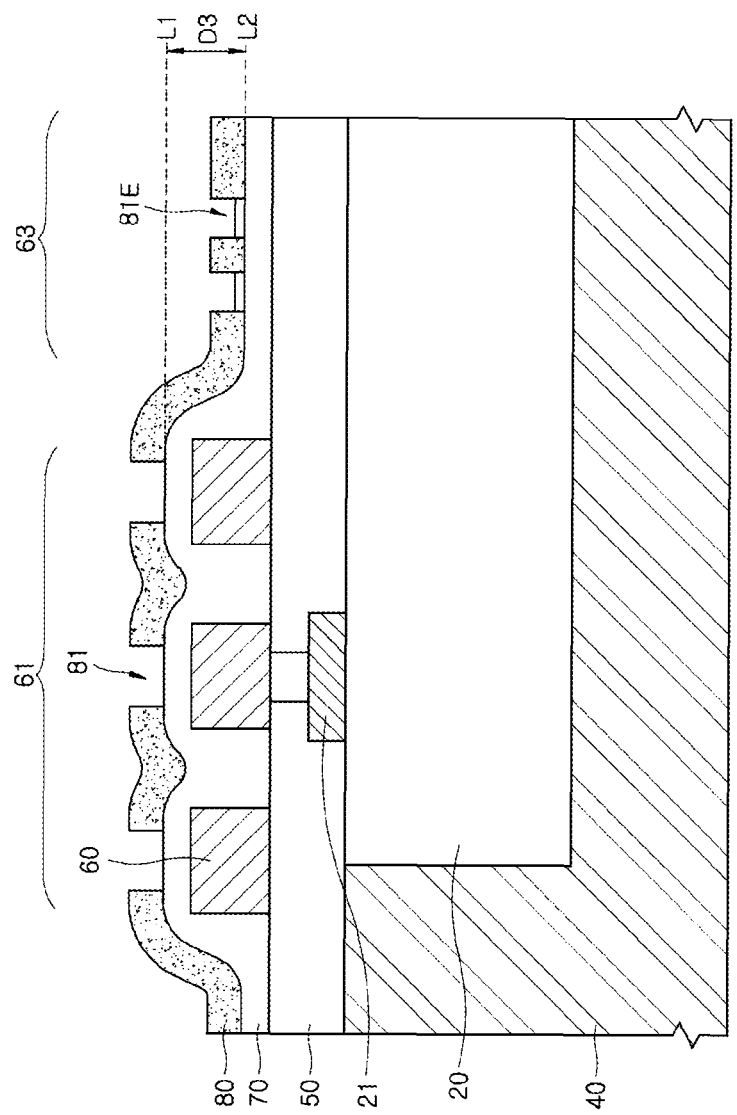
FIG. 6 is a cross-sectional view illustrating a representation of an example of a pattern distortion according to a pattern density of redistribution lines in fabrication of a wafer level package.

FIG. 6 is a cross-sectional view illustrating a representation of an example of a pattern distortion according to a pattern density of the redistribution lines 60 in fabrication of a wafer level package.

Referring to FIG. 6, the redistribution lines 60 may be formed on the first insulation layer 50 covering the die 20, and a second insulation layer 70 may be formed on the first insulation layer 50 to cover the redistribution lines 60. A surface of the second insulation layer 70 may have a level difference D3 between a region 61 in which the redistribution lines 60 are disposed and a region 63 in which the redistribution lines 60 are not disposed. The level difference D3 may correspond to a difference between a surface level L1 of a top surface of the second insulation layer 70 in the region 61 and a surface level L2 of a top surface of the second insulation layer 70 in the region 63. If the second insulation layer 70 has a top surface showing the level difference D3, some of opening portions 81 and 81E of resist patterns 80 formed on the second insulation layer 70 may have a pattern distortion. If an exposure condition of a photolithography process for forming the resist patterns 80 is determined using the region 61 as a target region, the opening portions 81 of the resist patterns 80 located in the region 61 may be normally formed to be fully opened while the opening portions 81E of the resist patterns 80 located in the region 63 are abnormally formed not to be fully opened. This pattern distortion may be due to the level difference D3 of the top surface of the second insulation layer 70.

According to the present disclosure, a protection substrate (or a protection wafer) may be used as a support wafer to support semiconductor dice (or semiconductor chips), the semiconductor dice may be attached to the protection substrate using an adhesive having a permanent bonding strength. Thus, after the semiconductor dice are attached to the protection substrate, the semiconductor dice may be strongly fixed to the protection substrate to prevent the semiconductor dice from being shifted during subsequent processes. The semiconductor dice may be covered with a photosensitive dielectric film using a lamination process, the photosensitive dielectric film may be planarized to provide a flat top surface of the photosensitive dielectric film. Subsequently, redistribution lines may be formed on the flat top surface of the photosensitive dielectric film. Thus, before the redistribution lines are formed, it may be possible to prevent the underlying dielectric layer from having an uneven topography. A silicon substrate used as the protection substrate may act as a portion of a package body. Thus, a mismatch issue due to the CTE difference between the package body and the protection substrate may be alleviated to suppress warpage of a wafer level package. Accordingly, the present disclosure may provide high performance semiconductor packages including interconnection lines having a fine pitch.

Figure 7:
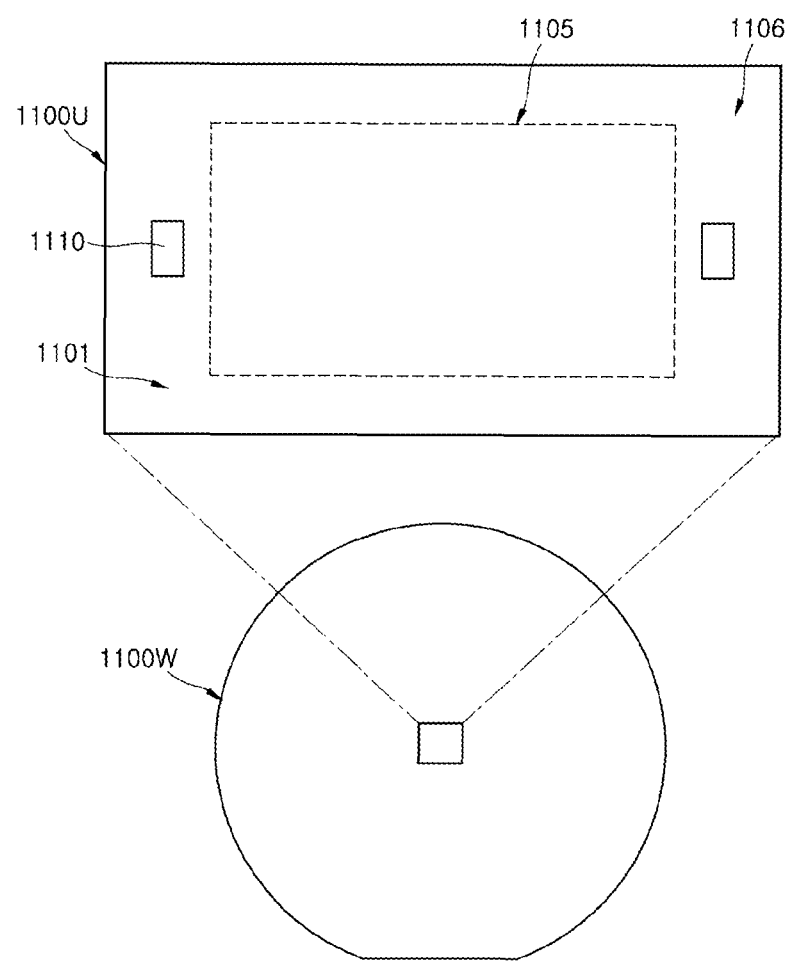
FIGS. 7 to 19 illustrate a representation of an example of a method of manufacturing a wafer level package according to an embodiment.

FIGS. 7 to 19 illustrate a representation of an example of a method of manufacturing a wafer level package according to an embodiment. FIG. 7 is a plan view of a protection wafer 1100W, and each of FIGS. 8 to 19 includes a cross-sectional view of a portion of the protection wafer 1100W.

Referring to FIG. 7, the protection wafer 1100W may be provided to manufacture a fan out semiconductor package using a fabrication technique of a wafer level package. The protection wafer 1100W may be a semiconductor wafer or a semiconductor substrate, for example, a silicon wafer. In some embodiments, the protection wafer 1100W may be a wafer comprised of a material which is different from a silicon material. In some other embodiments, the protection wafer 1100W may be comprised of a material having a CTE which is substantially equal to that of bodies of semiconductor dice (1200 of FIG. 8) which are attached to the protection wafer 1100W. In such a case, some failures (e.g., warpage) due to a CTE difference between the semiconductor dice and the protection substrate may be suppressed. For example, if each of the semiconductor dice (1200 of FIG. 8) has a silicon body, the protection wafer 1100W may be comprised of a silicon material.

Figure 8:
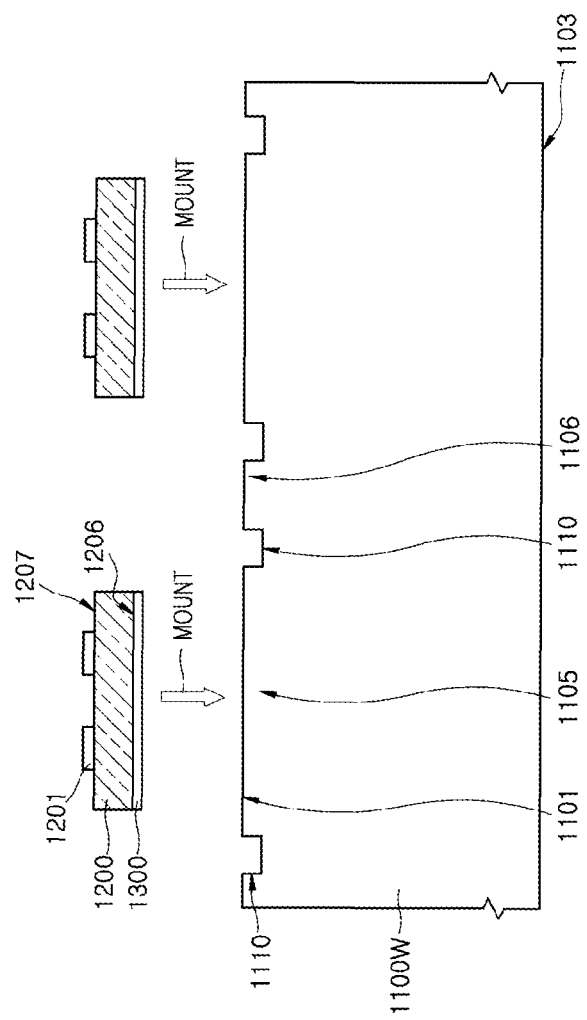

The protection wafer 1100W may be a silicon wafer having a thickness which is approximately ten times to approximately thirty times a thickness of the semiconductor dice (1200 of FIG. 8). For example, if the semiconductor dice (1200 of FIG. 8) have a thickness of approximately 30 micrometers to approximately 50 micrometers, the protection wafer 1100W may have a thickness of approximately 750 micrometers to approximately 770 micrometers. Since the protection wafer 1100W is much thicker than the semiconductor dice (1200 of FIG. 8), a volume ratio of the protection wafer 1100W to the package may be greater than a volume ratio of the semiconductor dice (1200 of FIG. 8) to the package. This may lead to suppression of effect which is due to a CTE difference between the semiconductor dice (1200 of FIG. 8) and other elements. Accordingly, warpage of the package may be suppressed.

The protection wafer 1100W may have a first surface 1101 and a second surface 1103 which are opposite to each other, and a distance between the first and second surfaces 1101 and 1103 may correspond to a thickness of the protection wafer 1100W. Alignment marks 1110 may be formed at the first surface 1101 of the protection wafer 1100W. The alignment marks 1110 may be used as reference marks for assigning positions of the semiconductor dice (1200 of FIG. 8) when the semiconductor dice (1200 of FIG. 8) are reconstituted in a subsequent process. The alignment marks 1110 may be formed in a boundary region 1106 of each of unit areas 1100U of the protection wafer 1100W. The protection wafer 1100W may include the plurality of unit areas 1100U. Each of the unit areas 1100U may be assigned to a single package. The unit areas 1100U may be arrayed to have a matrix form. Each of the unit areas 1100U may include a chip mounting region 1105 on which the semiconductor die 1200 is mounted and the boundary region 1106 surrounding the chip mounting region 1105 to act as a scribe lane. The protection wafer 1100W may include the plurality of unit areas 1100U which are two dimensionally arrayed. The alignment marks 1110 may be disposed in the boundary regions 1106 between the chip mounting regions 1105 adjacent to each other. Alternatively, the alignment marks 1110 may be disposed in the chip mounting regions 1105 to be adjacent to the boundary regions 1106. The alignment marks 1110 may be formed to have a surface which is lower or higher than the first surface 1101 of the protection wafer 1100W. For example, the alignment marks 1110 may be formed to have a groove shape or a concave shape by selectively etching portions of the first surface 1101 of the protection wafer 1100W. Thus, an accurate alignment may be achieved using the alignment marks 1110 in subsequent processes. That is, a level difference between the first surface 1101 of the protection wafer 1100W and bottom surfaces of the alignment marks 1110 may generate images having a high resolution, and a specific position of the protection wafer 1100W may be accurately set or recognized using the alignment mark images having a high resolution. The alignment marks 1110 may be located in each of the unit areas 1100U to provide reference positions. Thus, the semiconductor dice (1200 of FIG. 8) may be accurately aligned with the protection wafer 1100W using the alignment marks 1110 in a subsequent process.

Referring to FIG. 8, the semiconductor dice 1200 may be disposed over the first surface 1101 of the protection wafer 1100W to be respectively aligned with the chip mounting regions 1105 using the alignment marks 1110, and the semiconductor dice 1200 may be respectively mounted on the chip mounting regions 1105. Each of the semiconductor dice 1200 has a third face 1206 that faces the first surface 1101 of the protection wafer 1100W, and an adhesive layer 1300 may be provided on the third surfaces 1206 of the semiconductor dice 1200. Inner connectors 1201, for example, connection pads may be disposed on fourth surfaces 1207 of the semiconductor dice 1200 opposite to the protection wafer 1100W. Thus, the semiconductor dice 1200 may be mounted on the protection wafer 1100W so that the connection pads 1201 are disposed on surfaces of the semiconductor dice 1200 opposite to the protection wafer 1100W. The semiconductor dice 1200 may be respectively disposed on the chip mounting regions 1105 which are spaced apart from each other by the boundary regions 1106. Accordingly, the semiconductor dice 1200 may be arrayed side by side on the protection wafer 1100W.

The adhesive layer 1300 may provide permanent bonding between the protection wafer 1100W and the semiconductor dice 1200 to fix the semiconductor dice 1200 to the protection wafer 1100W. The adhesive layer 1300 may provide irreversible bonding between the protection wafer 1100W and the semiconductor dice 1200, unlike the temporary adhesive layer used to temporarily attach a temporary carrier (or a handling supporter) to semiconductor dice in general techniques for fabrication of wafer level packages. The temporary adhesive layer may lose its adhesive strength if UV rays are irradiated onto the temporary adhesive layer. Thus, the temporary carrier (or the handling supporter) may be detached from the semiconductor dice using UV rays. In an embodiment, the adhesive layer 1300 may be cured after the semiconductor dice 1200 are mounted on the protection wafer 1100W. In such a case, the cured adhesive layer 1300 does not lose its adhesive strength even though UV rays are irradiated onto the cured adhesive layer 1300. Thus, it may be possible to additionally perform a curing process using heat or UV rays even after the semiconductor dice 1200 are mounted on and bonded to the protection wafer 1100W. The adhesive layer 1300 may contain an indurative adhesive component, and the semiconductor dice 1200 may be irreversibly fixed to the protection wafer 1100W by a chemical reaction of the indurative adhesive component. The adhesive layer 1300 may contain an epoxy component acting as the indurative adhesive component, and the adhesive layer 1300 may be hardened by an epoxy reaction during a curing process to provide permanent and irreversible bonding between the protection wafer 1100W and the semiconductor dice 1200. Since the adhesive layer 1300 strongly bonds and fixes the semiconductor dice 1200 to the protection wafer 1100W, the adhesive layer 1300 may suppress the position shift of the semiconductor dice 1200 during subsequent processes. In the present disclosure, the protection wafer 1100W is not detached from the semiconductor dice 1200, and a portion of the protection wafer 1100W may constitute a portion of each package. Thus, an irreversible adhesive material which is capable of permanently fixing the semiconductor dice 1200 to the protection wafer 1100W may be used as the adhesive layer 1300.

In some embodiments, the adhesive layer 1300 may contain a thermal interface material component or a thermal conductive component to provide paths radiating or emitting heat generated by operation of the semiconductor dice 1200. If the thermal conductive component such as metal particles or the thermal interface material component is contained in the adhesive layer 1300, the heat generated in the semiconductor dice 1200 may be more readily emitted into the protection wafer 1100W. A thermal conductivity of the protection wafer 1100W may be higher than a thermal conductivity of photosensitive material layers which are formed to surround the semiconductor dice 1200 in a subsequent process. Thus, the heat generated in the semiconductor dice 1200 may be more effectively emitted if the adhesive layer 1300 contains the thermal interface material component or the thermal conductive component.

Figure 9:
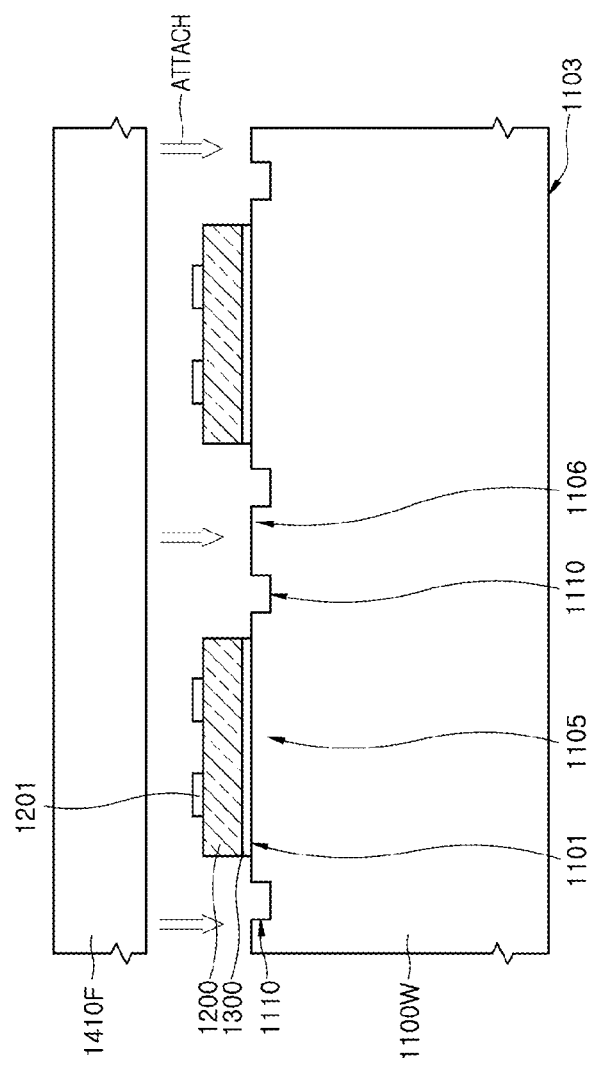
Figure 10:
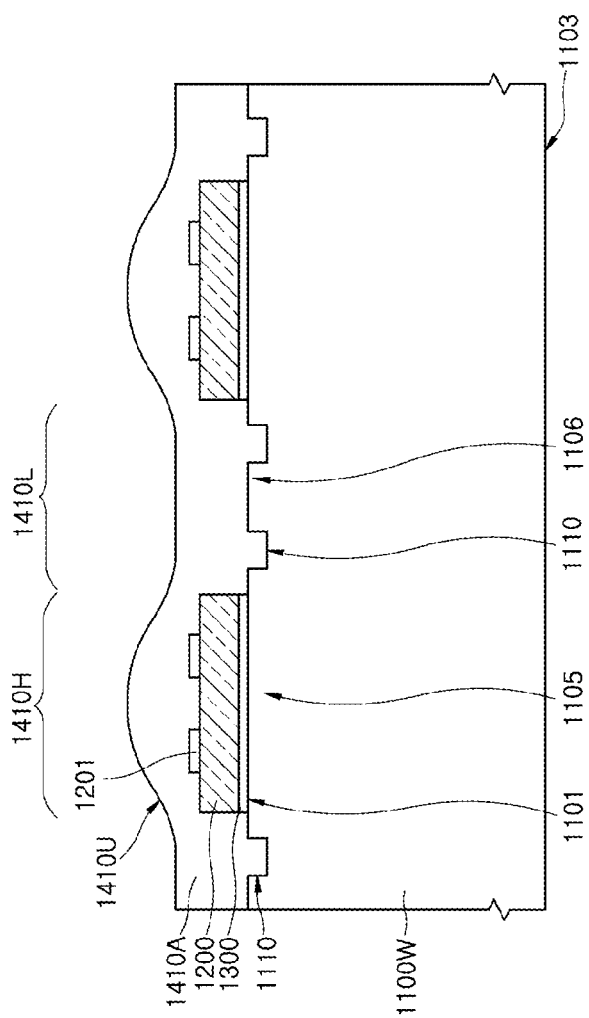

Referring to FIG. 9, a first photosensitive dielectric film 1410F may be provided on the semiconductor dice 1200. The first photosensitive dielectric film 1410F may be attached to the protection wafer 1100W to form a first photosensitive dielectric layer 1410A, Referring to FIG. 10. Accordingly, the semiconductor dice 1200 may be buried in the first photosensitive dielectric layer 1410A. The first photosensitive dielectric film (1410F of FIG. 9) may include a photosensitive polymer film such as a photosensitive polyimide film or a photosensitive polybenzoxazole film. In some embodiments, a photosensitive film containing an epoxy component may be used as the first photosensitive dielectric film 1410F. Since the first photosensitive dielectric film 1410F or the first photosensitive dielectric layer 1410A contains a photosensitizer, a portion of the first photosensitive dielectric layer 1410A exposed to a light such as a UV ray may have a solubility which is different from that of another portion of the first photosensitive dielectric layer 1410A unexposed to a light such as a UV ray.

The first photosensitive dielectric layer 1410A attached to the protection wafer 1100W may have an uneven surface 1410U. Since the first photosensitive dielectric film 1410F having a flat surface is laminated onto the protection wafer 1100W and the semiconductor dice 1200 to provide the first photosensitive dielectric layer 1410A, the uneven surface 1410U of the first photosensitive dielectric layer 1410A may be due to the surface morphology of the alignment marks 1110 and the semiconductor dice 1200. That is, a first portion 1410H of the first photosensitive dielectric layer 1410A overlapping with each semiconductor die 1200 may have a top surface which is higher than a top surface of a second portion 1410L of the first photosensitive dielectric layer 1410A disposed between the semiconductor dice 1200.

Figure 11:
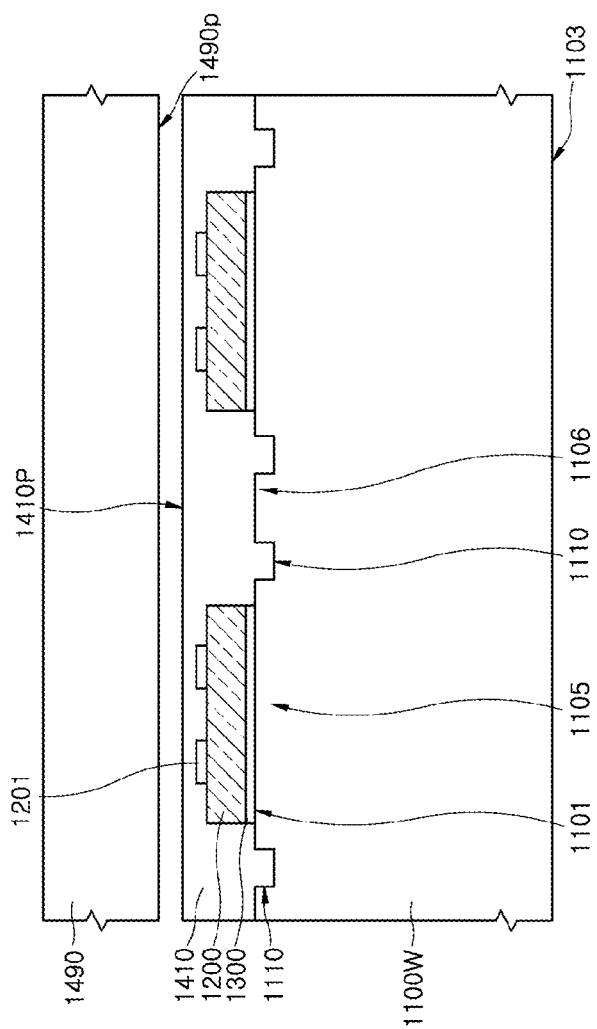

Referring to FIG. 11, a flattening step may be applied to the first photosensitive dielectric layer 1410A. For example, a planarization member 1490 having a flat surface 1490P may be located over the first photosensitive dielectric layer 1410A, and the planarization member 1490 may be pressed down with heat to change the uneven surface 1410U of the first photosensitive dielectric layer 1410A into a flat surface 1410P flattened by the flat surface 1490P of the planarization member 1490. As a result, a first photosensitive dielectric layer 1410 having the flat surface 1410P may be provided. The planarization member 1490 may be a mold frame having the flat surface 1490P. The planarization member 1490 may be a press roller. Even though the first photosensitive dielectric layer 1410A has the uneven surface 1410U due to the presence of the semiconductor dice 1200, the first photosensitive dielectric layer 1410A may be changed into the first photosensitive dielectric layer 1410 having the flat surface 1410P by the flattening step. Thus, it may be possible to form interconnection lines having a fine pitch on the flat surface 1410P of the first photosensitive dielectric layer 1410.

Figure 12:
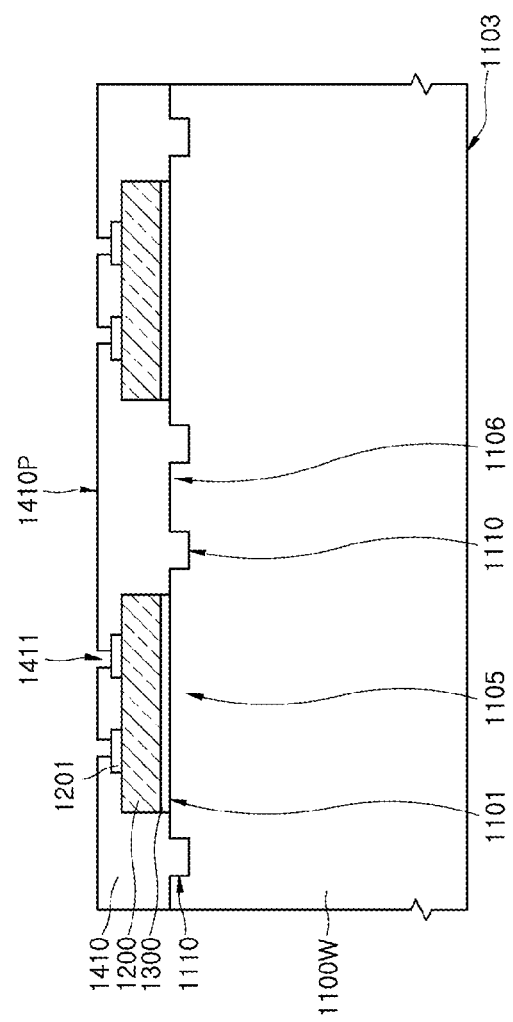

Referring to FIG. 12, first opening portions 1411 may be formed in the first photosensitive dielectric layer 1410 to expose portions of the semiconductor dice 1200, for example, the inner connectors 1201. The first opening portions 1411 may be formed to penetrate the first photosensitive dielectric layer 1410. The first opening portions 1411 may be formed by selectively exposing portions of the first photosensitive dielectric layer 1410 to a light such as a UV ray and by developing the exposed first photosensitive dielectric layer 1410. In such a case, since the first photosensitive dielectric layer 1410 has the flat surface 1410P, the first opening portions 1411 may be uniformly and accurately formed without any pattern distortion due to a defocus exposure or the like.

Figure 13:
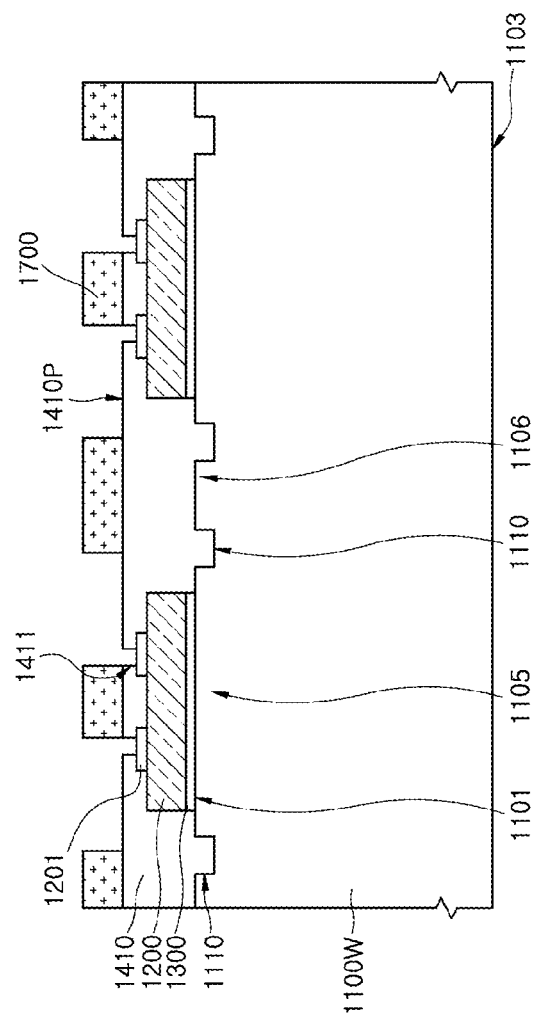

Referring to FIG. 13, a resist pattern 1700 may be formed on the first photosensitive dielectric layer 1410 having the first opening portions 1411. The resist pattern 1700 may be used as a mask, for example, a plating mask for forming redistribution lines. The resist pattern 1700 may be formed by coating a resist material on the first photosensitive dielectric layer 1410 and by patterning the resist material using an exposure process and a development process. The resist pattern 1700 may be formed to expose the first opening portions 1411 and to expose portions of the flat surface 1410P of the first photosensitive dielectric layer 1410 adjacent to the first opening portions 1411. Since the first photosensitive dielectric layer 1410 has the flat surface 1410P, the resist pattern 1700 may be formed to have an accurate size without some process issues due to an uneven surface of the underlying layer. The resist pattern 1700 may be formed to define regions on which redistribution lines are disposed.

Figure 14:
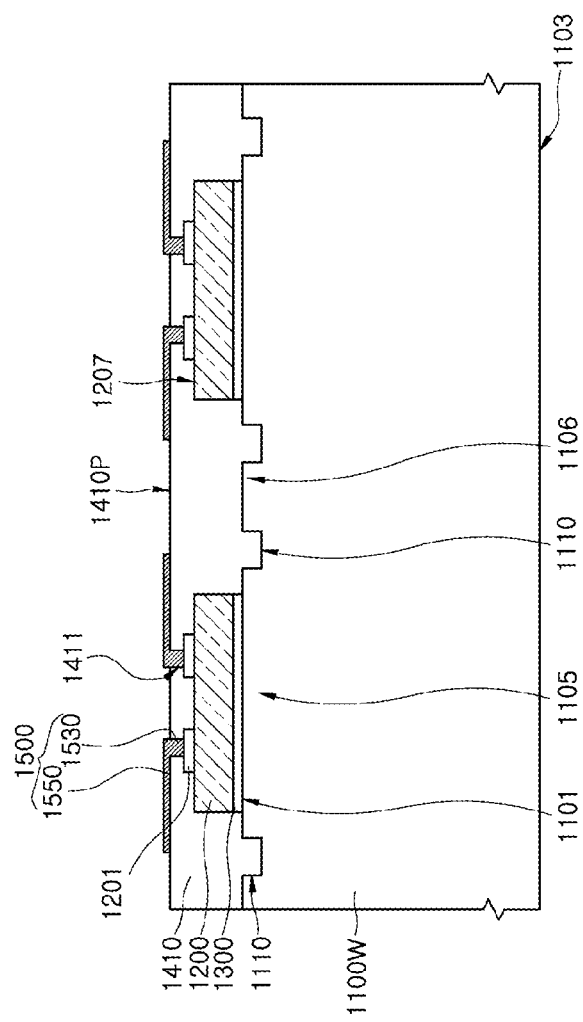

Referring to FIG. 14, redistribution lines 1500 may be formed on the flat surface 1410P of the first photosensitive dielectric layer 1410 exposed by the resist pattern (1700 of FIG. 13) and in the first opening portions 1411 exposed by the resist pattern 1700. The resist pattern 1700 may then be removed. The resist pattern 1700 may act as a patterning mask defining shapes of the redistribution lines 1500. The redistribution lines 1500 may be formed by depositing a plating layer including copper on the first photosensitive dielectric layer 1410 exposed by the resist pattern 1700, and the resist pattern 1700 may be removed. Alternatively, the redistribution lines 1500 may be formed by depositing a plating layer including copper on both of the first photosensitive dielectric layer 1410 and the resist pattern 1700 and by lifting off the resist pattern 1700.

Each of the redistribution lines 1500 may be formed to include a trace pattern 1550 located on the flat surface 1410P of the first photosensitive dielectric layer 1410 to act as an interconnection line and a via 1530 located in one of the first opening portions 1411 to electrically connect the trace pattern 1550 to one of the inner connectors 1201. The via 1530 may be formed to vertically penetrate the first photosensitive dielectric layer 1410 covering the fourth surface 1207 of the semiconductor die 1200 and to be in contact with one the inner connectors 1201. The via 1530 may be formed to fill one of the first opening portions 1411. The trace pattern 1550 may extend to overlap with a portion of the first photosensitive dielectric layer 1410 disposed between the semiconductor dice 1200.

Since the first photosensitive dielectric layer 1410 has the flat surface 1410P, the resist pattern (1700 of FIG. 13) may be formed to have a fine pitch without pattern distortion. Thus, the redistribution lines 1500, shapes of which are defined by the resist pattern (1700 of FIG. 13), may also be formed to have a fine pitch without pattern distortion. Accordingly, it may be possible to increase the number of the redistribution lines 1500 formed in a limited area.

Figure 15:
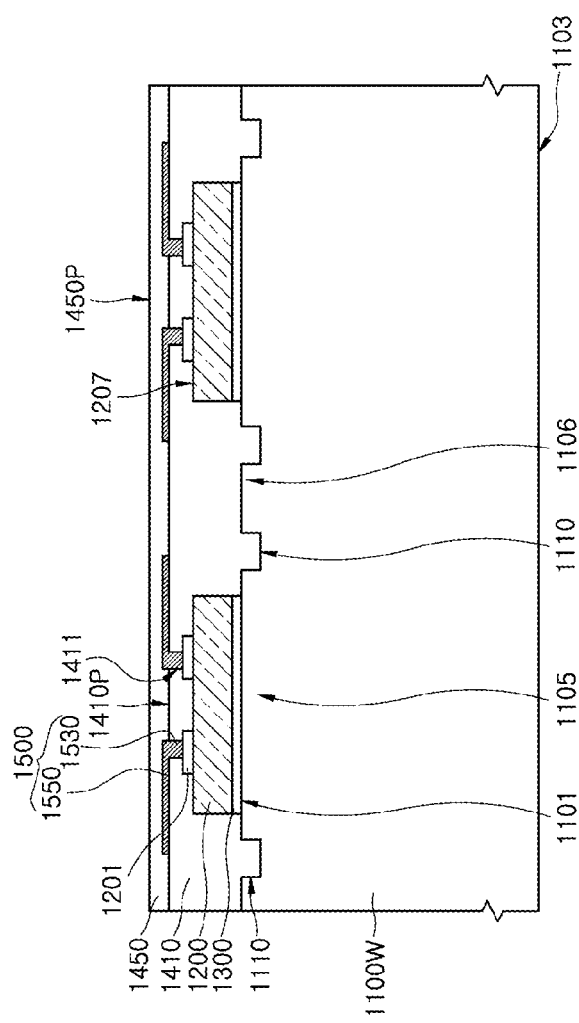

Referring to FIG. 15, a second photosensitive dielectric layer 1450 may be formed on the flat surface 1410P of the first photosensitive dielectric layer 1410 to cover the redistribution lines 1500. The second photosensitive dielectric layer 1450 may be formed using the same technique as used in formation of the first photosensitive dielectric layer 1410. That is, the second photosensitive dielectric layer 1450 may be formed by disposing a second photosensitive dielectric film (not illustrated) over the first photosensitive dielectric layer 1410 and the redistribution lines 1500 and by attaching the second photosensitive dielectric film to the first photosensitive dielectric layer 1410 using a lamination process. In such a case, the second photosensitive dielectric film may have an uneven top surface because of the presence of the redistribution lines 1500. Thus, the second photosensitive dielectric film attached to the first photosensitive dielectric layer 1410 may be planarized utilizing the same flattening step as used in planarization of the first photosensitive dielectric layer 1410A. As a result, the second photosensitive dielectric layer 1450 may be formed to have a flat surface 1450P, as illustrated in FIG. 15. Since the second photosensitive dielectric layer 1450 has the flat surface 1450P, fine patterns may be more readily formed on the second photosensitive dielectric layer 1450. In some embodiments, the second photosensitive dielectric layer 1450 may be formed of substantially the same material as the first photosensitive dielectric layer 1410.

If it is necessary to form redistribution lines having a multi-layered structure, the step of forming the redistribution lines 1500 and the step of forming the second photosensitive dielectric layer 1450 may be repeatedly performed. Even if the redistribution lines are formed to have a multi-layered structure, each photosensitive dielectric layer may be formed to have a flat top surface. Accordingly, all of the redistribution lines having a multi-layered structure may be formed to have a fine pitch.

Figure 16:
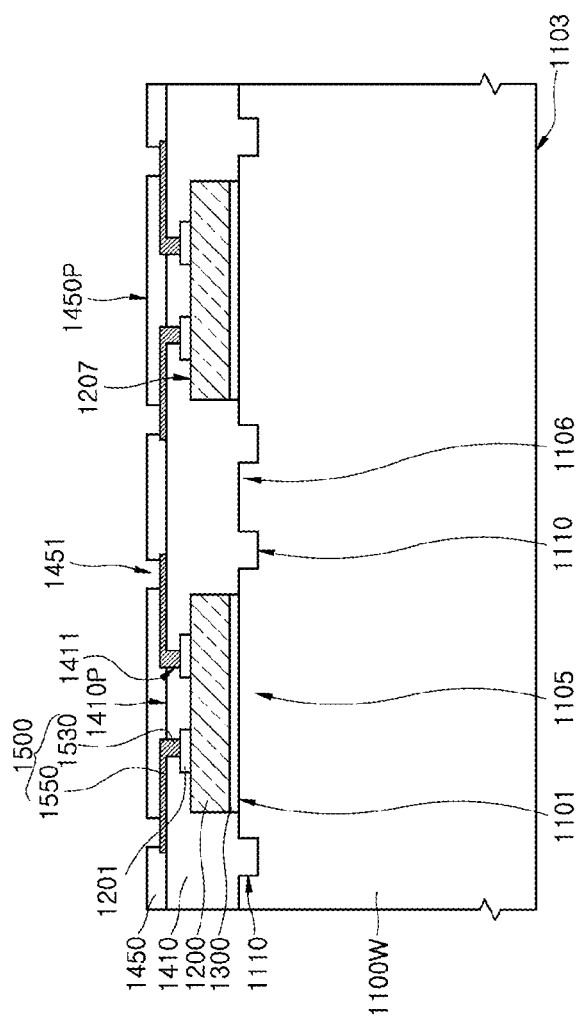

Referring to FIG. 16, the second photosensitive dielectric layer 1450 may be patterned to form second opening portions 1451 that penetrate portions of the second photosensitive dielectric layer 1450. The second opening portions 1451 may be formed by selectively exposing portions of the second photosensitive dielectric layer 1450 to a light such as a UV ray and by developing the exposed second photosensitive dielectric layer 1450. In such a case, since the second photosensitive dielectric layer 1450 has the flat surface 1450P, the second opening portions 1451 may be uniformly and accurately formed without any pattern distortion due to a defocus exposure or the like.

Figure 17:
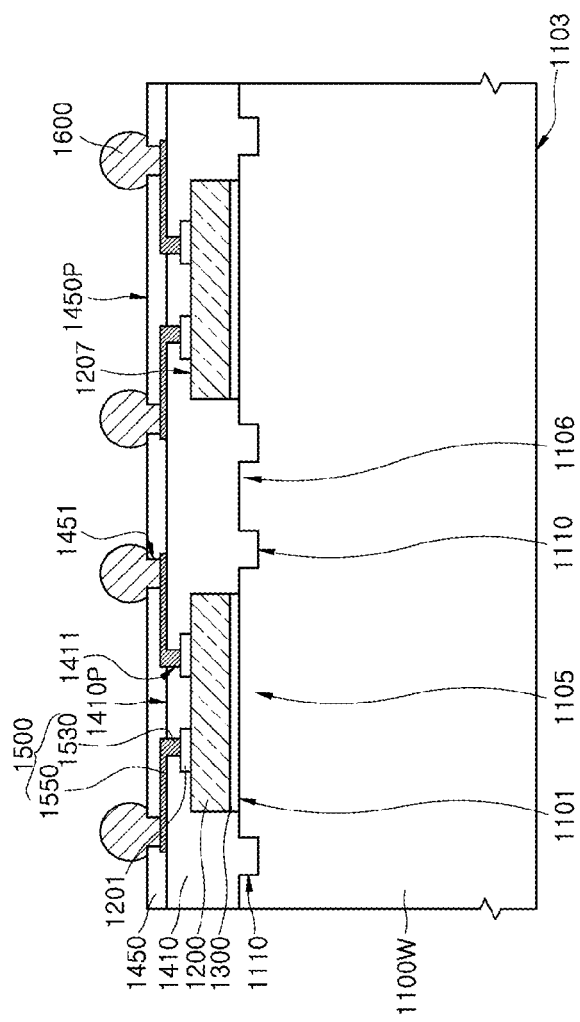

Each of the second opening portions 1451 may be formed to expose a portion of any one of the redistribution lines 1500. For example, each of the second opening portions 1451 may be formed to expose a portion of the trace pattern 1550 of any one of the redistribution lines 1500. Some of the second opening portions 1451 may be formed not to overlap with the semiconductor dice 1200. Referring to FIG. 17, outer connectors 1600 may be attached to the trace patterns 1550 exposed by the second opening portions 1451, respectively. Thus, the outer connectors 1600 may be electrically connected to the trace patterns 1550. The outer connectors 1600 may have a shape of a solder ball. Alternatively, the outer connectors 1600 may have a shape of a bump. Some of the outer connectors 1600 may be located not to overlap with the semiconductor dice 1200. The trace patterns 1550 may extend onto the boundary region 1106 between the chip mounting regions 1105 to realize fan out semiconductor packages.

Figure 18:
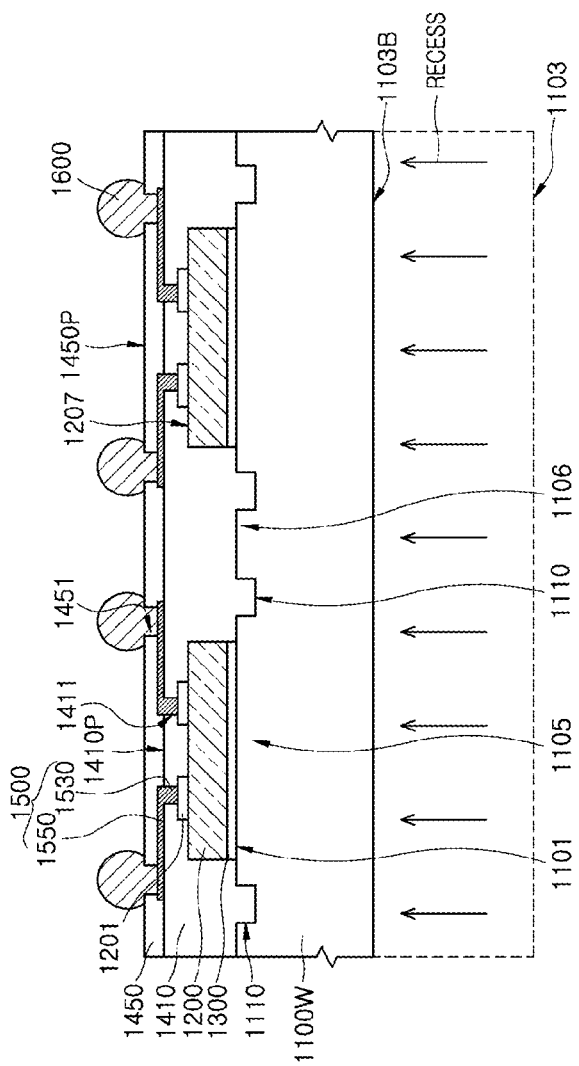

Referring to FIG. 18, a thinning step may be performed to reduce a thickness of the protection wafer 1100W. That is, the second surface 1103 of the protection wafer 1100W may be recessed to provide a recessed second surface 1103B. The thinning step may be performed by applying a grinding process to the second surface 1103 of the protection wafer 1100W. Alternatively, the thinning step may be performed by applying a chemical mechanical polishing (CMP) process or an etch-back process to the second surface 1103 of the protection wafer 1100W.

The initial protection wafer 1100W may be a silicon wafer having a thickness of approximately 750 micrometers to approximately 770 micrometers. After the thinning step is performed, the protection wafer 1100W may have a thickness of approximately 150 micrometers to approximately 400 micrometers. While the semiconductor dice 1200 have a thickness of approximately 30 micrometers to approximately 50 micrometers, the thinned protection wafer 1100W may still be thicker than the semiconductor dice 1200. The thinned protection wafer 1100W may have a thickness of at least 150 micrometers in consideration of a minimum thickness that is required to protect the semiconductor dice 1200. Since the thinned protection wafer 1100W has a thickness which is approximately three times to approximately fifteen times a thickness of the semiconductor dice 1200, a volume ratio of the thinned protection wafer 1100W to the package may be greater than a volume ratio of the semiconductor dice 1200 to the package. This may lead to suppression of effect which is due to a CTE difference between the semiconductor dice 1200 and the photosensitive dielectric layers 1410 and 1450. Accordingly, warpage of the package may be suppressed.

Figure 19:
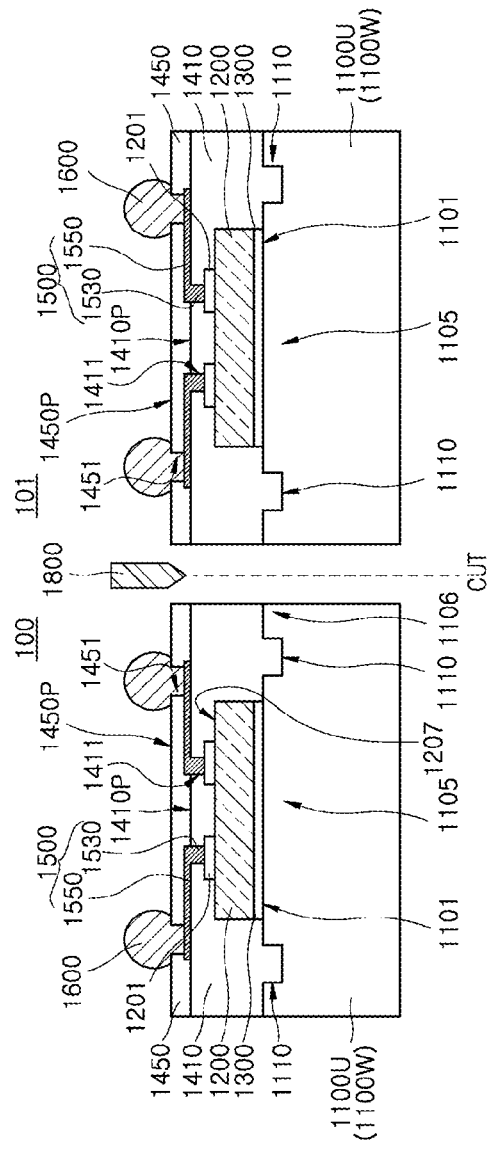

Referring to FIG. 19, the second photosensitive dielectric layer 1450, the first photosensitive dielectric layer 1410 and the thinned protection wafer 1100W may be cut along the boundary region 1106 between the chip mounting regions 1105 using a singulation process, thereby providing wafer level packages 100 and 101 which are separated from each other. For example, a sawing blade 1800 may be disposed over the boundary region 1106 acting as a scribe lane, and the photosensitive dielectric layers 1450 and 1410 and the thinned protection wafer 1100W may be cut along the boundary region 1106 using the sawing blade 1800 to produce the wafer level packages 100 and 101 which are separated from each other. Even after the photosensitive dielectric layers 1450 and 1410 and the thinned protection wafer 1100W are cut to produce the wafer level packages 100 and 101 wafer level packages 100 and 101, each of the wafer level packages 100 and 101 may still include a portion of the thinned protection wafer 1100W, that is, a unit protection wafer 1100U. Thus, the unit protection wafer 1100U may still cover the third surface 1206 of the semiconductor die 1200 to protect the semiconductor die 1200.

Figure 20:
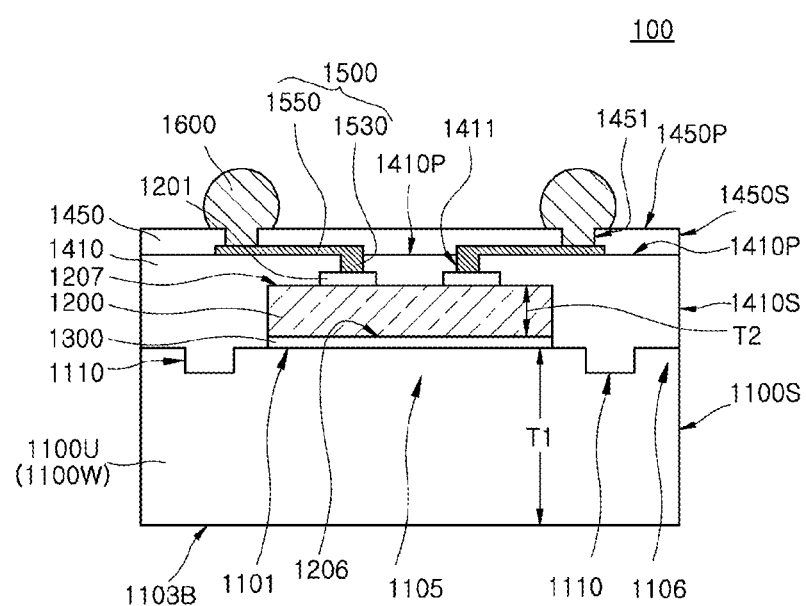
FIG. 20 is a cross-sectional view illustrating a representation of an example of a wafer level package according to an embodiment.

FIG. 20 is a cross-sectional view illustrating a representation of an example of the wafer level package 100 according to an embodiment.

Referring to FIG. 20, the wafer level package 100 may correspond to a fan out semiconductor package. The wafer level package 100 may include the semiconductor die 1200 attached to the first surface 1101 of the unit protection wafer 1100U using the adhesive layer 1300. The wafer level package 100 may further include the first photosensitive dielectric layer 1410 that covers the semiconductor die 1200 and has sidewalls 1410S and the flat top surface 1410P. The wafer level package 100 may include the second photosensitive dielectric layer 1450 stacked on the first photosensitive dielectric layer 1410. The second photosensitive dielectric layer 1450 may have sidewalls 1450S aligned with the sidewalls 1410S of the first photosensitive dielectric layer 1410 and the flat top surface 1450P. The sidewalls 1410S and the sidewalls 1450S may be aligned with sidewalls 1100S of the unit protection wafer 1100U. The alignment marks 1110 may be provided at the first surface 1101 of the unit protection wafer 1100U and may be disposed to be adjacent to the semiconductor die 1200. A thickness T1 of the unit protection wafer 1100O may be greater than a thickness T2 of the semiconductor die 1200.

The wafer level package 100 may also include the redistribution lines 1500 that are disposed between the first and second photosensitive dielectric layers 1410 and 1450. The redistribution lines 1500 may extend into the first photosensitive dielectric layer 1410 and may be electrically connected to the inner connectors 1201 of the semiconductor die 1200. The semiconductor die 1200 may have the third and fourth surfaces 1206 and 1207 which are opposite to each other, and the inner connectors 1201 may be disposed on the fourth surface 1207 of the semiconductor die 1200. The wafer level package 100 may also include the outer connectors 1600 disposed on the flat top surface 1450P of the second photosensitive dielectric layer 1450. The outer connectors 1600 may extend into the second photosensitive dielectric layer 1450 and may be electrically connected to the trace patterns 1550 of the redistribution lines 1500. The outer connectors 1600 may have a shape of a solder ball.

FIGS. 21 to 30 are cross-sectional views illustrating a representation of an example of a method of manufacturing a wafer level package according to an embodiment.

Figure 21:
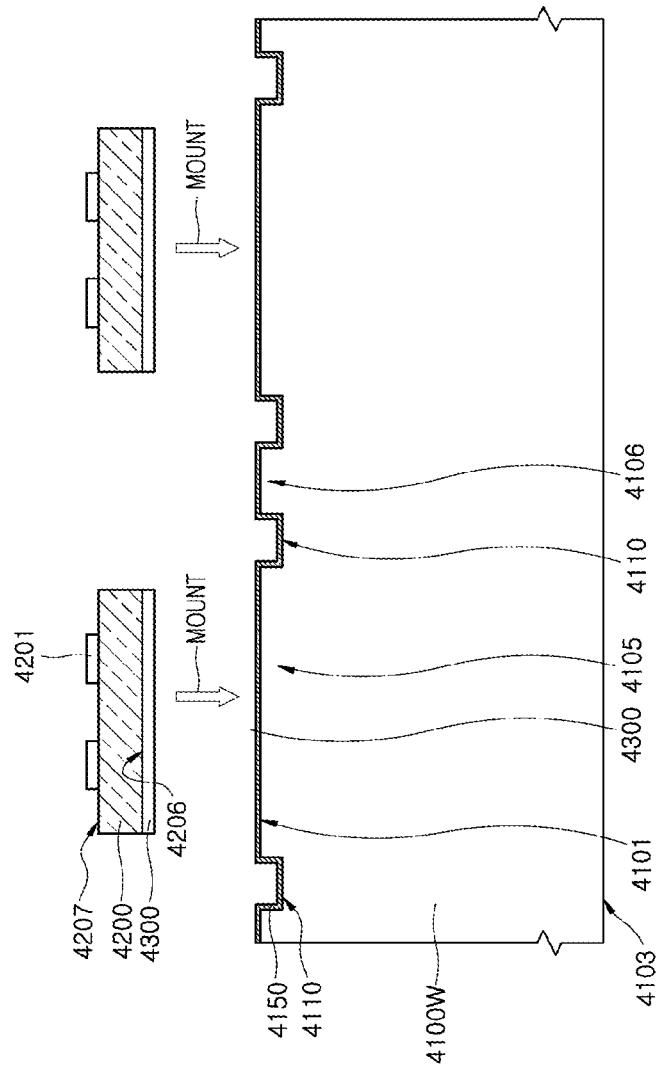
FIGS. 21 to 30 are cross-sectional views illustrating a representation of an example of a method of manufacturing a wafer level package according to an embodiment.

Referring to FIG. 21, a protection wafer 4100W may be provided to manufacture a fan out semiconductor package using a fabrication technique of a wafer level package. The protection wafer 4100W may be a semiconductor wafer or a semiconductor substrate, for example, a silicon wafer. In some embodiments, the protection wafer 4100W may be a wafer comprised of a material which is different from a silicon material. In some other embodiments, the protection wafer 4100W may be comprised of a material having a CTE which is substantially equal to that of bodies of semiconductor dice 4200 which are attached to the protection wafer 4100W. In such a case, some failures (e.g., warpage) due to a CTE difference between the semiconductor dice and the protection substrate may be suppressed. For example, if each of the semiconductor dice 4200 has a silicon body, the protection wafer 4100W may be comprised of a silicon material.

The protection wafer 4100W may have a first surface 4101 and a second surface 4103 which are opposite to each other, and alignment marks 4110 may be formed at the first surface 4101 of the protection wafer 4100W. The alignment marks 4110 may be used as reference marks for assigning positions of the semiconductor dice 4200 when the semiconductor dice 4200 are reconstituted in a subsequent process. The protection wafer 4100W may include a plurality of chip mounting regions 4105 and a boundary region 4106 between the plurality of chip mounting regions 4105. The semiconductor dice 4200 may be respectively mounted on the chip mounting regions 4105, and the boundary region 4106 may act as a scribe lane. Accordingly, the boundary region 4106 may surround the chip mounting regions 4105. The alignment marks 4110 may be disposed in the boundary regions 4106 to be adjacent to the chip mounting regions 4105. The alignment marks 4110 may be formed to have a surface which is lower or higher than the first surface 4101 of the protection wafer 4100W. For example, the alignment marks 4110 may be formed to have a groove shape or a concave shape by selectively etching portions of the first surface 4101 of the protection wafer 4100W. Thus, an accurate alignment may be achieved using the alignment marks 4110 in subsequent processes. That is, a level difference between the first surface 4101 of the protection wafer 4100W and bottom surfaces of the alignment marks 4110 may generate images having a high resolution, and a specific position of the protection wafer 4100W may be accurately set or recognized using the alignment mark images having a high resolution.

A conductive layer may be formed on the first surface 4101 including the alignment marks 4110 to provide a first shielding layer 4150 for shielding the semiconductor dice 4200 from electromagnetic interference (hereinafter, referred to as 'EMI'). The first shielding layer 4150 may be formed by depositing a metal layer such as a copper layer using a chemical vapor deposition (CVD) process or an electroplating process. If the protection wafer 4100W is a silicon wafer, all of the processes for manufacturing the wafer level package may be performed utilizing apparatuses used in semiconductor fabrication.

The semiconductor dice 4200 may be disposed over the first surface 4101 of the protection wafer 4100W to be respectively aligned with the chip mounting regions 4105 using the alignment marks 4110, and the semiconductor dice 4200 may be respectively mounted on the chip mounting regions 4105. Each of the semiconductor dice 4200 has a third face 4206 that faces the first surface 4101 of the protection wafer 4100W, and an adhesive layer 4300 may be provided on the third surfaces 4206 of the semiconductor dice 4200. Inner connectors 4201, for example, connection pads may be disposed on fourth surfaces 4207 of the semiconductor dice 4200 opposite to the protection wafer 4100W. Thus, the semiconductor dice 4200 may be mounted on the protection wafer 4100W using the adhesive layer 4300. The adhesive layer 4300 may provide permanent bonding between the protection wafer 4100W and the semiconductor dice 4200 to fix the semiconductor dice 4200 to the protection wafer 4100W. The adhesive layer 4300 may provide irreversible bonding between the protection wafer 4100W and the semiconductor dice 4200, unlike the temporary adhesive layer used to temporarily attach a temporary carrier (or a handling supporter) to semiconductor dice in general techniques for fabrication of wafer level packages. The temporary adhesive layer may lose its adhesive strength if UV rays are irradiated onto the temporary adhesive layer. Thus, the temporary carrier (or the handling supporter) may be detached from the semiconductor dice using UV rays. In an embodiment, the adhesive layer 4300 may be cured after the semiconductor dice 4200 are mounted on the protection wafer 4100W. In such a case, the cured adhesive layer 4300 does not lose its adhesive strength even though UV rays are irradiated onto the cured adhesive layer 4300. The adhesive layer 4300 may contain an epoxy component acting as an indurative adhesive component. Since the adhesive layer 4300 strongly bonds and fixes the semiconductor dice 4200 to the protection wafer 4100W, the adhesive layer 4300 may suppress the position shift of the semiconductor dice 4200 during subsequent processes. In the present disclosure, the protection wafer 4100W is not detached from the semiconductor dice 4200, and a portion of the protection wafer 4100W may constitute a portion of each package. Thus, an irreversible adhesive material which is capable of permanently fixing the semiconductor dice 4200 to the protection wafer 4100W may be used as the adhesive layer 4300.

In some embodiments, the adhesive layer 4300 may contain a thermal interface material component or a thermal conductive component to provide paths radiating or emitting heat generated by operation of the semiconductor dice 4200. If the thermal conductive component such as metal particles or the thermal interface material component is contained in the adhesive layer 4300, the heat generated in the semiconductor dice 4200 may be more readily emitted into the first shielding layer 4150 and the protection wafer 4100W. A thermal conductivity of the protection wafer 4100W may be higher than a thermal conductivity of photosensitive material layers (4410 and 4450 of FIG. 26) which are formed to surround the semiconductor dice 4200 in subsequent processes. Thus, the heat generated in the semiconductor dice 4200 may be more effectively emitted.

The inner connectors 4201, for example, connection pads may be disposed on the fourth surfaces 4207 of the semiconductor dice 4200 opposite to the protection wafer 4100W. Thus, the semiconductor dice 4200 may be mounted on the protection wafer 4100W so that the connection pads 4201 are disposed on surfaces (i.e., the fourth surfaces 4207) of the semiconductor dice 4200 opposite to the protection wafer 4100W. The semiconductor dice 4200 may be respectively disposed over the chip mounting regions 4105 which are spaced apart from each other by the boundary regions 4106. Accordingly, the semiconductor dice 4200 may be arrayed side by side on the first shielding layer 4150.

Figure 22:
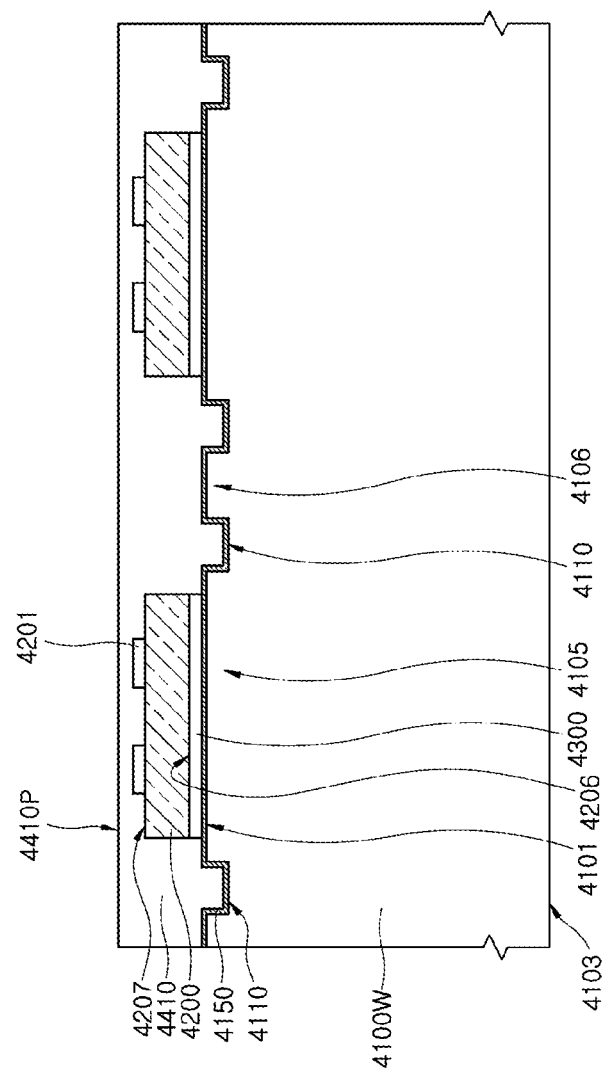

Referring to FIG. 22, a first photosensitive dielectric layer 4410 may be formed on the first shielding layer 4150 to cover the semiconductor dice 4200. The first photosensitive dielectric layer 4410 may be formed by attaching a first photosensitive dielectric film to the first shielding layer 4150 and the semiconductor dice 4200 using a lamination process and by planarizing the first photosensitive dielectric film attached to the first shielding layer 4150 and the semiconductor dice 4200, as described with reference to FIGS. 9, 10 and 11. As a result, the first photosensitive dielectric layer 4410 may have a flat top surface 4410P. The first photosensitive dielectric layer 4410 may include a photosensitive polymer film such as a photosensitive polyimide film or a photosensitive polybenzoxazole film. In some embodiments, the first photosensitive dielectric layer 4410 may be formed of a photosensitive film containing an epoxy component. Since the first photosensitive dielectric layer contains a photosensitizer, a portion of the first photosensitive dielectric layer 4410 exposed to a light such as a UV ray may have a solubility which is different from that of another portion of the first photosensitive dielectric layer 4410 unexposed to a light such as a UV ray.

The first photosensitive dielectric layer 4410 may have the flat top surface 4410P, even though the first surface 4101 has an uneven surface due to the alignment marks 4110 and the semiconductor dice 4200 are disposed on the first surface 4101. Since the first photosensitive dielectric layer 4410 has the flat top surface 4410P, it may be possible to form fine patterns on the flat top surface 4410P of the first photosensitive dielectric layer 4410 without pattern distortions. That is, it may be possible to form interconnection lines having a fine pitch on the flat top surface 4410P of the first photosensitive dielectric layer 4410 without pattern distortions.

Figure 23:
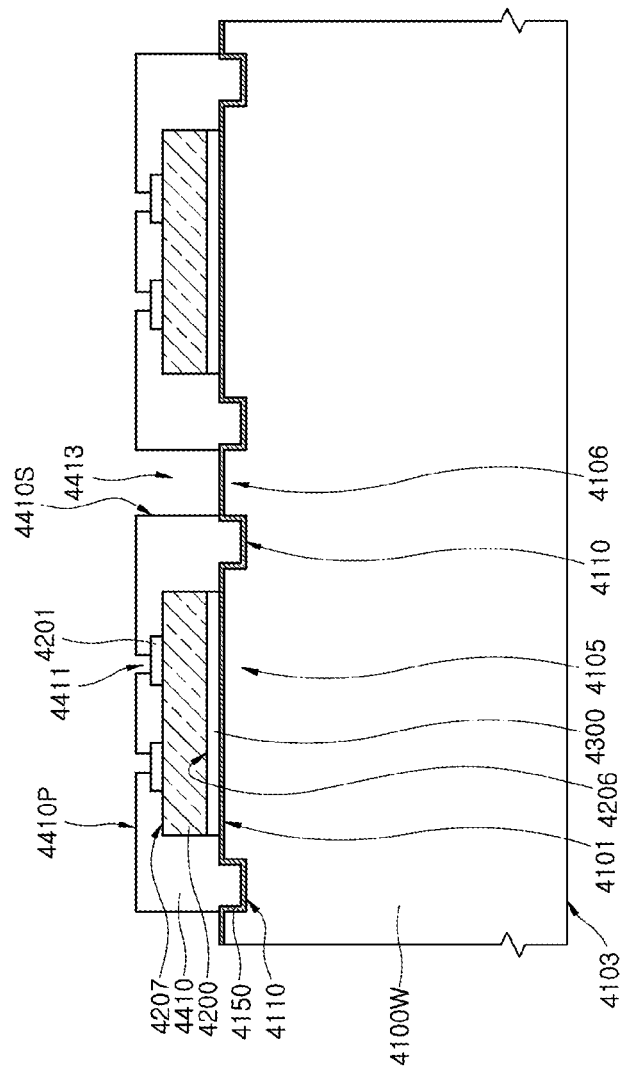

Referring to FIG. 23, first opening portions 4411 may be formed in the first photosensitive dielectric layer 4410 to expose portions of the semiconductor dice 4200, for example, the inner connectors 4201. The first opening portions 4411 may be formed to penetrate the first photosensitive dielectric layer 4410. While the first opening portions 4411 are formed, a trench 4413 may also be formed in the first photosensitive dielectric layer 4410 to expose a portion of the first shielding layer 4150. The trench 4413 may be formed to expose a portion of the first shielding layer 4150 overlapping with the boundary region 4106 acting as a scribe lane. Since the trench 4413 is formed along the boundary region 4106, the trench 4413 may surround the semiconductor dice 4200. The first photosensitive dielectric layer 4410 may be separated into a plurality of patterns by the trench 4413, and sidewalls 4410S of the first photosensitive dielectric patterns 4410 may be exposed by the trench 4413.

The first opening portions 4411 and the trench 4413 may be formed to penetrate the first photosensitive dielectric layer 4410 by selectively exposing portions of the first photosensitive dielectric layer 4410 to a light such as a UV ray and by developing the exposed first photosensitive dielectric layer 4410. In such a case, since the first photosensitive dielectric layer 4410 is formed of a photosensitive dielectric film, a photolithography process may be directly applied to the first photosensitive dielectric layer 4410 to form the first opening portions 4411 and the trench 4413. Thus, the first opening portions 4411 and the trench 4413 may be formed even without using any additional photoresist material.

Figure 24:
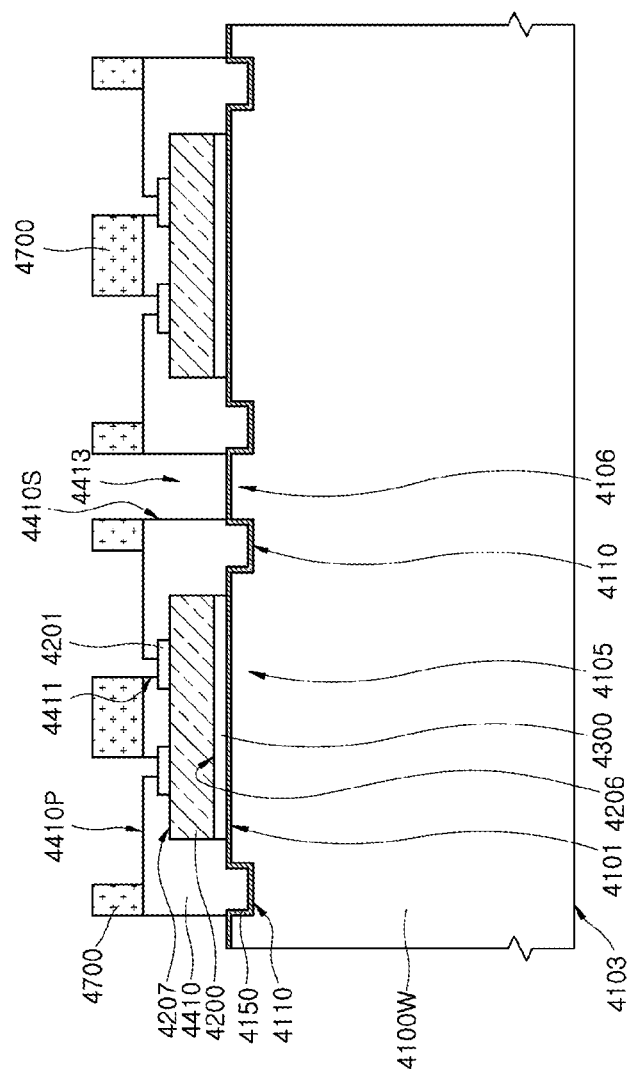

Referring to FIG. 24, a resist pattern 4700 may be formed on the first photosensitive dielectric layer 4410 having the first opening portions 4411 and the trench 4413. The resist pattern 4700 may be used as a mask, for example, a plating mask for forming redistribution lines. The resist pattern 4700 may be formed by coating a resist material on the first photosensitive dielectric layer 4410 and by patterning the resist material using an exposure process and a development process. The resist pattern 4700 may be formed to expose the first opening portions 4411 and the trench 4413 as well as to expose portions of the flat top surface 4410P of the first photosensitive dielectric layer 4410 adjacent to the first opening portions 4411. The resist pattern 4700 may be formed to define regions on which redistribution lines are disposed.

Figure 25:
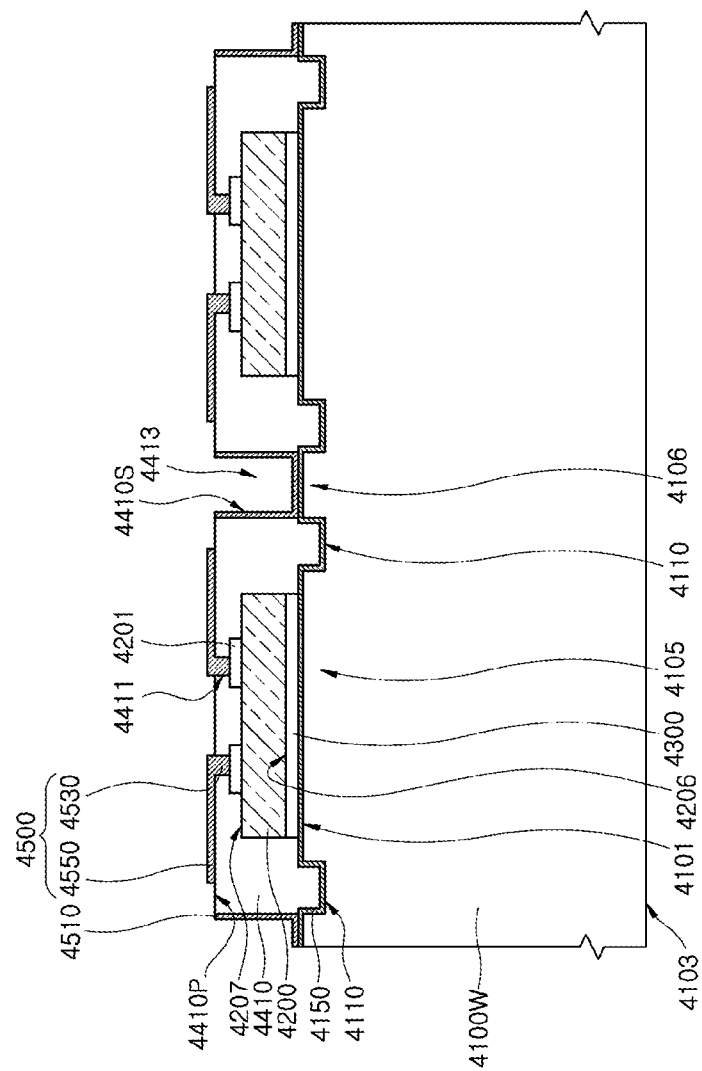

Referring to FIG. 25, redistribution lines 4500 may be formed on the flat top surface 4410P of the first photosensitive dielectric layer 4410 exposed by the resist pattern (4700 of FIG. 24) and in the first opening portions 4411 and the trench 4413 exposed by the resist pattern 4700. The resist pattern 4700 may then be removed. The resist pattern 4700 may act as a patterning mask defining shapes of the redistribution lines 4500. The redistribution lines 4500 may be formed by selectively depositing a plating layer including copper on the first photosensitive dielectric layer 4410 exposed by the resist pattern 4700, and the resist pattern 4700 may be removed. Alternatively, the redistribution lines 4500 may be formed by depositing a conductive layer including copper on both of the first photosensitive dielectric layer 4410 and the resist pattern 4700 and by lifting off the resist pattern 4700.

After the resist pattern 4700 is lifted off to pattern the conductive layer, conductive patterns remaining on the flat top surface 4410P of the first photosensitive dielectric layer 4410 and in the first opening portions 4411 may correspond to the redistribution lines 4500, and conductive patterns remaining in the trench 4413 may correspond to a second shielding layer 4510. The second shielding layer 4510 may be formed to contact the first shielding layer 4150 exposed by the trench 4413. Thus, the second shielding layer 4510 may be electrically connected to the first shielding layer 4150. Accordingly, the first and second shielding layers 4150 and 4510 may surround bottom surfaces (i.e., the third surfaces 4206) and sidewalls of the semiconductor dice 4200 to constitute EMI shielding cages for shielding the semiconductor dice 4200 from EMI. In some embodiments, the second shielding layer 4510 and the redistribution lines 4500 may be formed by depositing a conductive layer on an entire surface of the first photosensitive dielectric layer 4410 having the first opening portions 4411 and the trench 4413, by forming a resist pattern (not illustrated) on the conductive layer, and by etching the conductive layer using the resist pattern as an etch mask.

Each of the redistribution lines 4500 may be formed to include a trace pattern 4550 located on the flat top surface 4410P of the first photosensitive dielectric layer 4410 to act as an interconnection line and a via 4530 located in one of the first opening portions 4411 to electrically connect the trace pattern 4550 to one of the inner connectors 4201. The via 4530 may be formed to vertically penetrate the first photosensitive dielectric layer 4410 covering the fourth surface 4207 of the semiconductor die 4200 and to be in contact with one the inner connectors 4201. The via 4530 may be formed to fill one of the first opening portions 4411. The trace pattern 4550 may extend to overlap with a portion of the first photosensitive dielectric layer 4410 disposed between the semiconductor dice 4200.

Since the first photosensitive dielectric layer 4410 has the flat top surface 4410P, the resist pattern (4700 of FIG. 24) may be formed to have a fine pitch without pattern distortion. Thus, the redistribution lines 4500, shapes of which are defined by the resist pattern (4700 of FIG. 24), may also be formed to have a fine pitch without pattern distortion. Accordingly, it may be possible to increase the number of the redistribution lines 4500 formed in a limited area.

Figure 26:
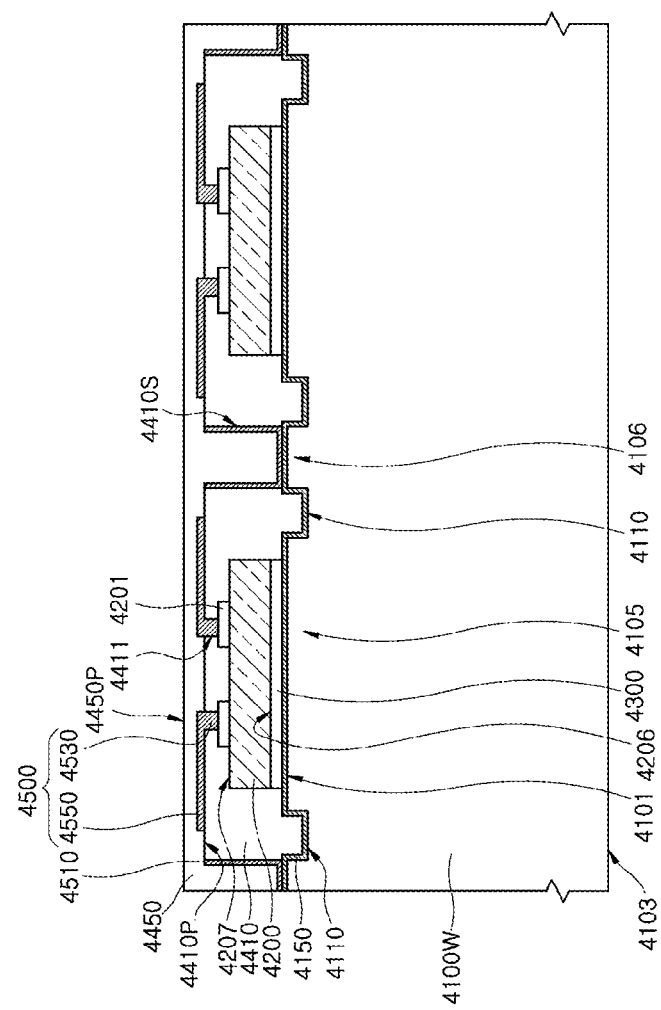

Referring to FIG. 26, a second photosensitive dielectric layer 4450 may be formed on the flat top surface 4410P of the first photosensitive dielectric layer 4410 to cover the redistribution lines 4500 and the second shielding layer 4510. The second photosensitive dielectric layer 4450 may be formed by disposing a second photosensitive dielectric film (not illustrated) over the first photosensitive dielectric layer 4410 and the redistribution lines 4500 and by attaching the second photosensitive dielectric film to the first photosensitive dielectric layer 4410 using a lamination process. The second photosensitive dielectric film attached to the first photosensitive dielectric layer 4410 may be planarized to provide the second photosensitive dielectric layer 4450 having a flat top surface 4450P. Since the second photosensitive dielectric layer 4450 has the flat surface 4450P, fine patterns may be more readily formed on the second photosensitive dielectric layer 4450. In some embodiments, the second photosensitive dielectric layer 4450 may be formed of substantially the same material as the first photosensitive dielectric layer 4410.

Figure 27:
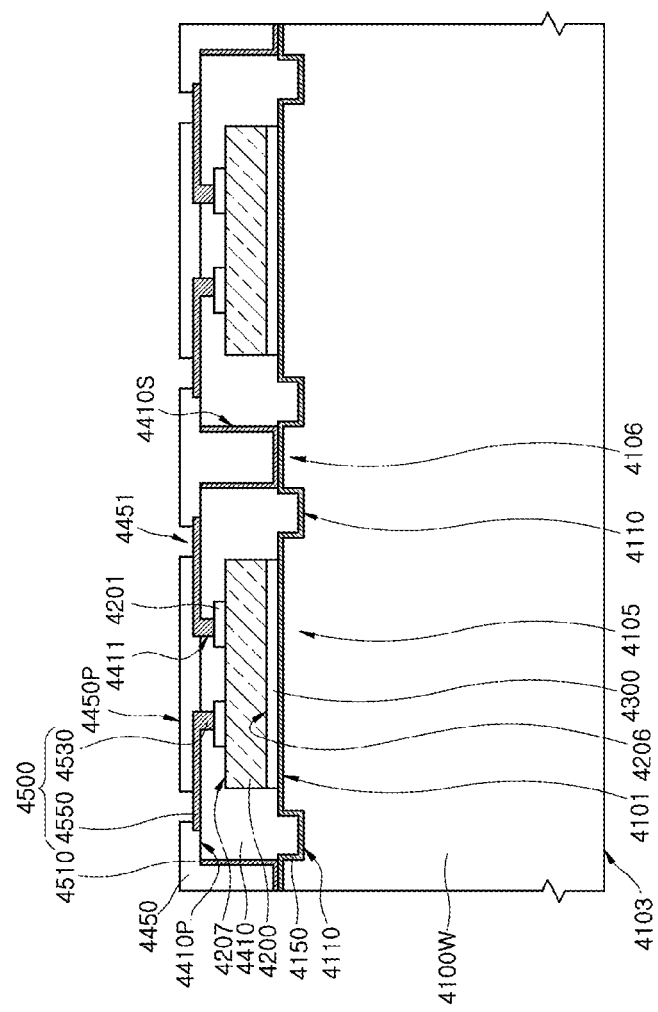

Referring to FIG. 27, the second photosensitive dielectric layer 4450 may be patterned to form second opening portions 4451 that penetrate portions of the second photosensitive dielectric layer 4450. Each of the second opening portions 4451 may be formed to expose a portion of any one of the trace patterns 4550 of the redistribution lines 4500. Some of the second opening portions 4451 may be formed not to overlap with the semiconductor dice 4200. That is, some of the second opening portions 4451 may be formed over the boundary region 4106.

Figure 28:
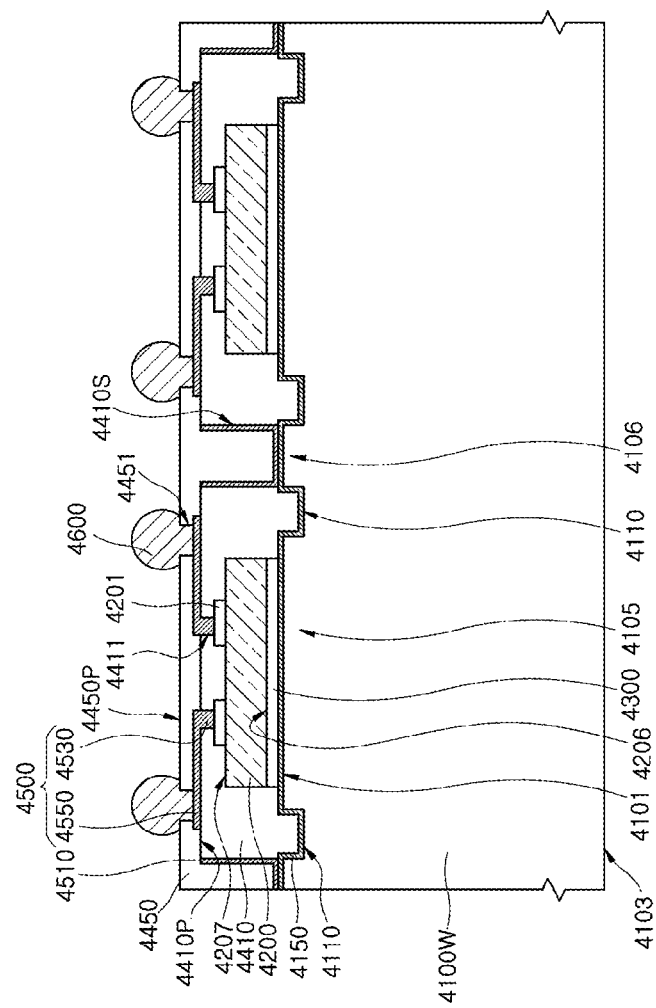

Referring to FIG. 28, outer connectors 4600 may be attached to the trace patterns 4550 exposed by the second opening portions 4451, respectively. Thus, the outer connectors 4600 may be electrically connected to the trace patterns 4550. The outer connectors 4600 may have a shape of a solder ball. Alternatively, the outer connectors 4600 may have a shape of a bump. Some of the outer connectors 4600 may be located not to overlap with the semiconductor dice 4200. The trace patterns 4550 may extend onto the boundary region 4106 between the chip mounting regions 4105 to realize fan out semiconductor packages.

Figure 29:
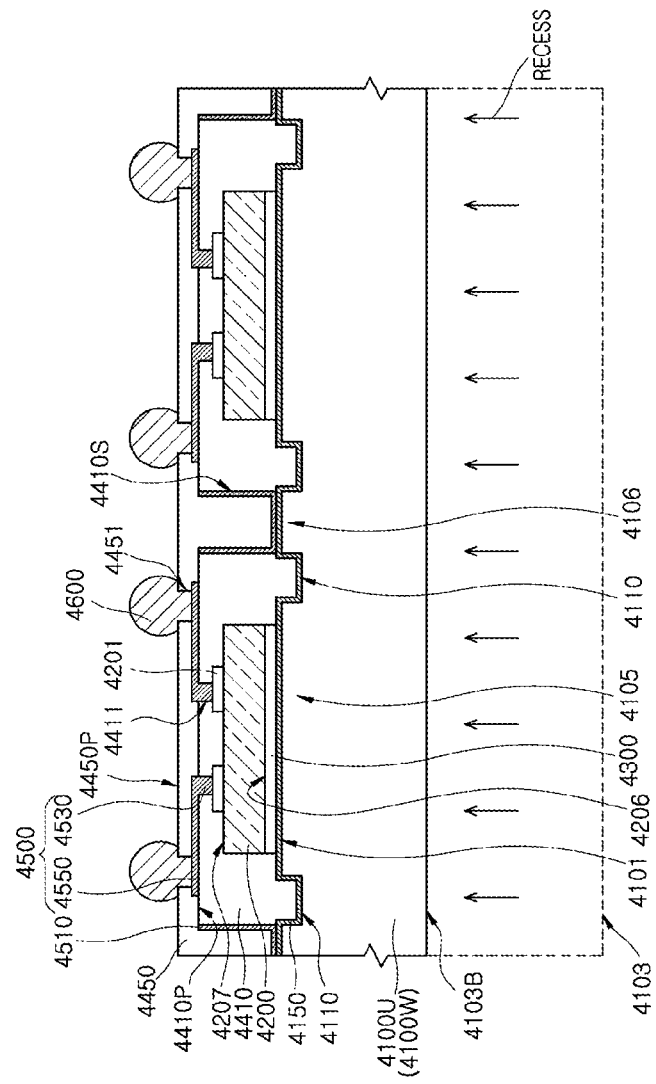

Referring to FIG. 29, a thinning step may be performed to reduce a thickness of the protection wafer 4100W. That is, the second surface 4103 of the protection wafer 4100W may be recessed to provide a recessed second surface 4103B. The thinning step may be performed by applying a grinding process to the second surface 4103 of the protection wafer 4100W. Alternatively, the thinning step may be performed by applying a chemical mechanical polishing (CMP) process or an etch-back process to the second surface 4103 of the protection wafer 4100W.

Figure 30:
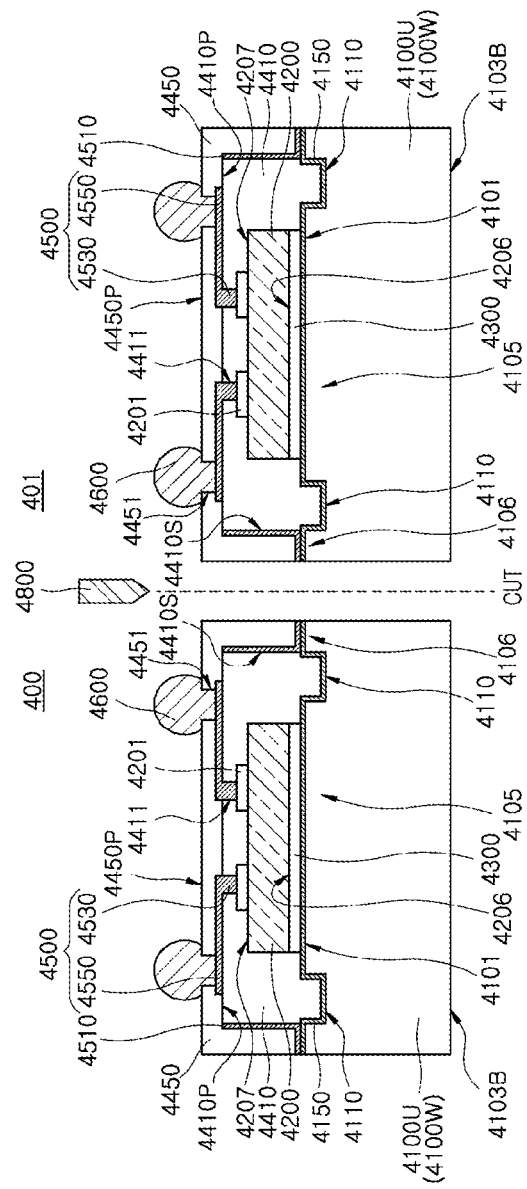

Referring to FIG. 30, the second photosensitive dielectric layer 4450, the first photosensitive dielectric layer 4410 and the thinned protection wafer 4100W may be cut along the boundary region 4106 between the chip mounting regions 4105 using a singulation process, thereby providing wafer level packages 400 and 401 which are separated from each other. For example, a sawing blade 4800 may be disposed over the boundary region 4106 acting as a scribe lane, and the photosensitive dielectric layers 4450 and 4410 and the thinned protection wafer 4100W may be cut along the boundary region 4106 using the sawing blade 4800 to produce the wafer level packages 400 and 401 which are separated from each other. Each of the wafer level packages 400 and 401 may still include a portion of the thinned protection wafer 4100W, that is, a unit protection wafer 4100U. Thus, the unit protection wafer 4100U may still cover the third surface 4206 of the semiconductor die 4200 to protect the semiconductor die 4200.

Figure 31:
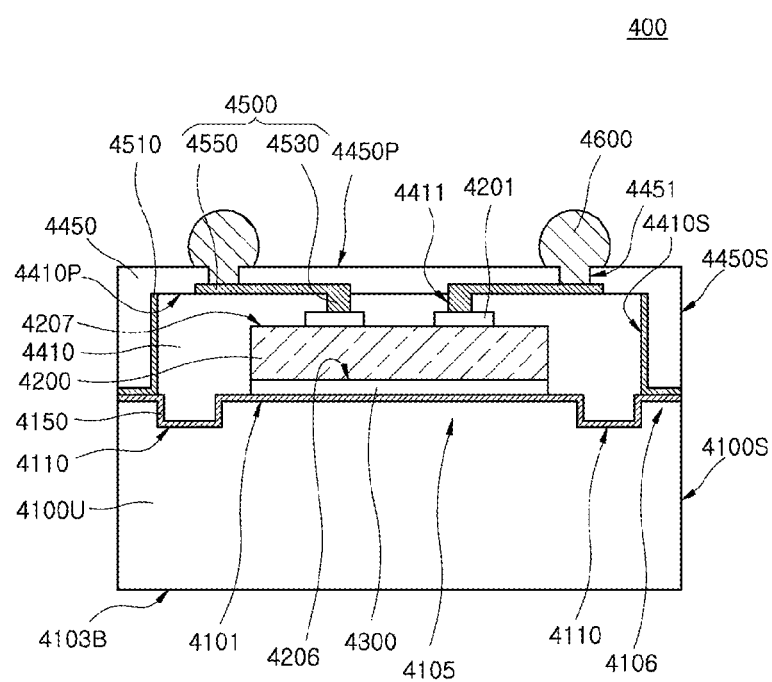
FIG. 31 is a cross-sectional view illustrating a representation of an example of a wafer level package according to an embodiment.

FIG. 31 is a cross-sectional view illustrating a representation of an example of a wafer level package 400 according to an embodiment.

Referring to FIG. 31, the wafer level package 400 may correspond to a fan out semiconductor package. The wafer level package 400 may include the unit protection wafer 4100U having the first surface 4101 and the second surface 4103B which are opposite to each other. The wafer level package 400 may further include the first shielding layer 4150 covering the first surface 4101 of the unit protection wafer 4100U. The wafer level package 400 may include the semiconductor die 4200 attached to the first shielding layer 4150 using the adhesive layer 4300. The wafer level package 400 may include the first photosensitive dielectric layer 4410 that covers the semiconductor die 4200 and has sidewalls 4410S and the flat top surface 4410P. The wafer level package 400 may additionally include the second photosensitive dielectric layer 4450 that covers the sidewalls 4410S and the flat top surface 4410P of the first photosensitive dielectric layer 4410. The second photosensitive dielectric layer 4450 may have sidewalls 4450S and the flat top surface 4450P. The second shielding layer 4510 may be disposed between the second photosensitive dielectric layer 4450 and the sidewalls 4410S of the first photosensitive dielectric layer 4410. That is, the second shielding layer 4510 may be disposed to cover the sidewalls 4410S of the first photosensitive dielectric layer 4410. The second shielding layer 4510 may be electrically connected to the first shielding layer 4150 covering the first surface 4101 of the unit protection wafer 4100U.

The wafer level package 400 may also include the redistribution lines 4500 that are disposed between the top surface 4410P of the first photosensitive dielectric layer 4410 and a bottom surface of the second photosensitive dielectric layer 4450. The redistribution lines 4500 may extend into the first photosensitive dielectric layer 4410 and may be electrically connected to the inner connectors 4201 of the semiconductor die 4200. The redistribution lines 4500 and the second shielding layer 4510 may be provided by patterning a single conductive layer. The second shielding layer 4510 may extend to overlap with a portion of the first shielding layer 4150.

The semiconductor die 4200 may have the third and fourth surfaces 4206 and 4207 which are opposite to each other, and the inner connectors 4201 may be disposed on the fourth surface 4207 of the semiconductor die 4200. Each of the redistribution lines 4500 may include a via 4530 penetrating a portion of the first photosensitive dielectric layer 4410 and a trace pattern 4550 disposed on the top surface 4410P of the first photosensitive dielectric layer 4410. The wafer level package 400 may also include the outer connectors 4600 electrically connected to the redistribution lines 4500.

Figure 32:
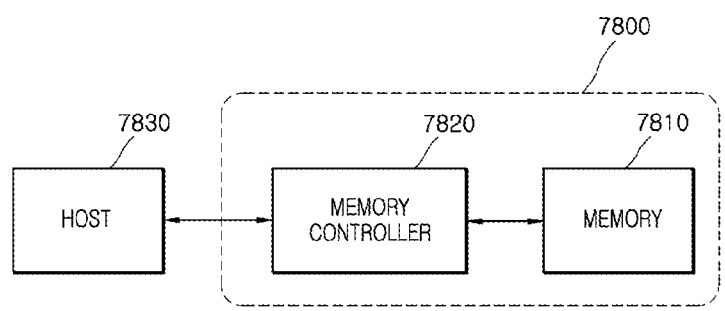
FIG. 32 is a block diagram illustrating a representation of an example of an electronic system employing a memory card including a package according to an embodiment.

FIG. 32 is a block diagram illustrating a representation of an example of an electronic system including a memory card 7800 including at least one semiconductor package according to an embodiment. The memory card 7800 includes a memory 7810 such as a nonvolatile memory device, and a memory controller 7820. The memory 7810 and the memory controller 7820 may store data or read stored data. The memory 7810 and/or the memory controller 7820 include one or more semiconductor chips disposed in a package according to an embodiment.

The memory 7810 may include a nonvolatile memory device to which the technology of the embodiments is applied. The memory controller 7820 may control the memory 7810 such that stored data is read out or data is stored in response to a read/write request from a host 7830.

Figure 33:
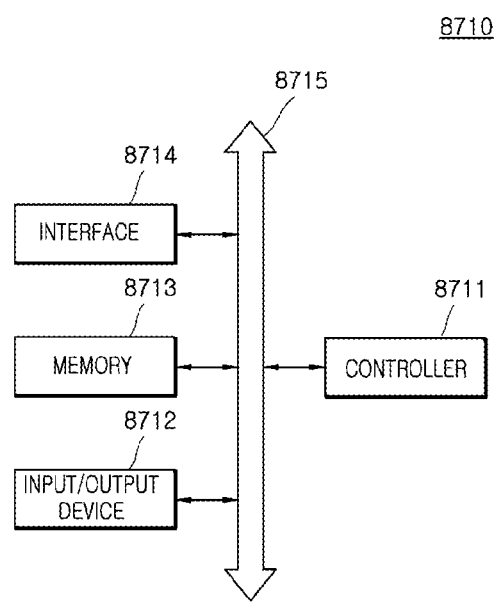
FIG. 33 is a block diagram illustrating a representation of an example of an electronic system including a package according to an embodiment.

FIG. 33 is a block diagram illustrating a representation of an example of an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A wafer level package comprising:
   alignment marks disposed at a first surface of a protection wafer;
   a semiconductor die disposed on the first surface of the protection wafer to be spaced apart from the alignment marks;
   a first photosensitive dielectric layer covering the semiconductor die and having a flat top surface;
   a second photosensitive dielectric layer covering the flat top surface of the first photosensitive dielectric layer;
   redistribution lines disposed between the first photosensitive dielectric layer and the second photosensitive dielectric layer and electrically connected to the semiconductor die through first opening portions penetrating the first photosensitive dielectric layer; and
   outer connectors disposed on the second dielectric layer and electrically connected to the redistribution lines through second opening portions penetrating the second dielectric layer.

2. The wafer level package of claim 1, wherein the protection wafer includes a silicon wafer.

3. The wafer level package of claim 1, wherein at least one of the redistribution lines extends onto an outside region of the semiconductor die.

4. The wafer level package of claim 1, wherein a thickness of the protection wafer is greater than a thickness of the semiconductor die.

5. The wafer level package of claim 1, wherein the second photosensitive dielectric layer includes sidewalls aligned with sidewalls of the first photosensitive dielectric layer and the flat top surface of the first photosensitive dielectric layer.

6. The wafer level package of claim 1,
   wherein sidewalls of the first photosensitive dielectric layer are aligned with sidewalls of the second photosensitive dielectric layer and sidewalls of the protection wafer.

7. The wafer level package of claim 1, wherein the outer connectors include the shape of a solder ball.

8. The wafer level package of claim 1, further comprising:
   an adhesive layer located between the semiconductor die and protection wafer.

9. The wafer level package of claim 1, wherein the second photosensitive dielectric layer has a flat top surface where the outer connectors are disposed on the second dielectric layer.

10. A wafer level package comprising:
    a first shielding layer covering a first surface of a protection wafer;

a semiconductor die mounted on the first shielding layer;

a first dielectric layer covering the semiconductor die and having a top surface and sidewalls;

a second dielectric layer covering the top surface and the sidewalls of the first dielectric layer;

a second shielding layer disposed between the second dielectric layer and the sidewalls of the first dielectric layer to cover the sidewalls of the first dielectric layer;

redistribution lines disposed between the second dielectric layer and the top surface of the first dielectric layer and electrically connected to the semiconductor die through first opening portions penetrating the first dielectric layer; and outer connectors disposed on the second dielectric layer and electrically connected to the redistribution lines through second opening portions penetrating the second dielectric layer.

11. The wafer level package of claim 10, further comprising alignment marks disposed at the first surface of the protection wafer.

12. The wafer level package of claim 10, wherein the top surface of the first dielectric layer includes a flat surface.

13. The wafer level package of claim 12, wherein the flat top surface of the first dielectric layer is configured to allow the resist pattern to be formed with a fine pitch and substantially without pattern distortion.

14. The wafer level package of claim 10, wherein the top surface of the second dielectric layer includes a flat surface.

15. The wafer level package of claim 10, wherein the first and second dielectric layers are photosensitive dielectric layers.

16. The wafer level package of claim 10, wherein the second shielding layer extends to overlap with a portion of the first shielding layer.

17. The wafer level package of claim 10, wherein the second shielding layer is electrically connected to the first shielding layer covering the first surface of the protection layer.

18. The wafer level package of claim 10, further comprising:

an adhesive layer located between the semiconductor die and the first shielding layer.

19. An electronic system including a package, the package comprising:

alignment marks disposed at a first surface of a protection wafer;

a semiconductor die disposed on the first surface of the protection wafer to be spaced apart from the alignment marks;

a first photosensitive dielectric layer covering the semiconductor die and having a flat top surface;

a second photosensitive dielectric layer covering the flat top surface of the first photosensitive dielectric layer;

redistribution lines disposed between the first photosensitive dielectric layer and the second photosensitive dielectric layer and electrically connected to the semiconductor die through first opening portions penetrating the first photosensitive dielectric layer; and outer connectors disposed on the second dielectric layer and electrically connected to the redistribution lines through second opening portions penetrating the second dielectric layer.

* * * * *

UNITED STATES PATENT AND TRADEMARK OFFICE
CERTIFICATE OF CORRECTION

PATENT NO. : 9,837,360 B2  
APPLICATION NO. : 15/243296  
DATED : December 5, 2017  
INVENTOR(S) : Hyeong Seok Choi et al.

Page 1 of 1

It is certified that error appears in the above-identified patent and that said Letters Patent is hereby corrected as shown below:

On the Title Page

Item (54)  
Replace "WAFER LEVEL PACKAGES AND ELECTRONICS SYSTEM INCLUDING THE SAME" with --WAFER LEVEL PACKAGES AND ELECTRONIC SYSTEM INCLUDING THE SAME--

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*